(12) United States Patent
Russell et al.

(10) Patent No.: US 9,279,835 B2
(45) Date of Patent: Mar. 8, 2016

(54) DEVICE FOR DETECTING A LOAD TYPE

(71) Applicant: Control4 Corporation, Salt Lake City, UT (US)

(72) Inventors: James K. Russell, Salt Lake City, UT (US); David Lynn Bytheway, Salt Lake City, UT (US); William Richard Schonle, Salt Lake City, UT (US)

(73) Assignee: Control4 Corporation, Salt Lake City, UT (US)

(*) Notice: Subject to any disclaimer, the term of this patent is extended or adjusted under 35 U.S.C. 154(b) by 389 days.

(21) Appl. No.: 13/748,994

(22) Filed: Jan. 24, 2013

(65) Prior Publication Data
US 2013/0187631 A1 Jul. 25, 2013

Related U.S. Application Data

(60) Provisional application No. 61/590,678, filed on Jan. 25, 2012.

(51) Int. Cl.
G01R 25/00 (2006.01)
G01R 19/175 (2006.01)
G01R 19/25 (2006.01)
H02M 1/08 (2006.01)

(52) U.S. Cl.
CPC .......... G01R 19/175 (2013.01); G01R 19/2506 (2013.01); H02M 1/081 (2013.01)

(58) Field of Classification Search
CPC .. G01R 19/175; G01R 19/2506; H02M 1/081
USPC ...................................... 324/76.77
See application file for complete search history.

(56) References Cited

U.S. PATENT DOCUMENTS

| 5,239,255 | A | * | 8/1993 | Schanin | G05F 1/455 323/237 |
| 5,606,510 | A | | 2/1997 | Glaser et al. | |
| 7,336,463 | B2 | * | 2/2008 | Russell | H05B 39/048 307/36 |
| 8,373,394 | B1 | * | 2/2013 | Huta | G05F 1/70 323/211 |
| 2004/0222779 | A1 | * | 11/2004 | Cock | H02P 6/182 324/76.77 |
| 2005/0174070 | A1 | | 8/2005 | Vanderzon | |
| 2007/0057641 | A1 | * | 3/2007 | Russell | H05B 39/048 315/209 R |

(Continued)

FOREIGN PATENT DOCUMENTS

EP 1 313 205 5/2003

OTHER PUBLICATIONS

International Search Report issued for International Application No. PCT/US2013/023096 on Apr. 12, 2013.

Primary Examiner — Benjamin M Baldridge
(74) Attorney, Agent, or Firm — Austin Rapp & Hardman

(57) ABSTRACT

A method for detecting a load type is described. The method includes placing an electronic device in a forward phase mode. The method also includes operating a load at a maximum allowable level. The method additionally includes capturing a voltage waveform. The method further includes capturing a current waveform. The method also includes obtaining a voltage zero-cross based on the voltage waveform. The method additionally includes obtaining a current zero-cross based on the current waveform. The method further includes determining the load type based on the voltage zero-cross and the current zero-cross.

15 Claims, 18 Drawing Sheets

(56) References Cited

U.S. PATENT DOCUMENTS

| | | | |
|---|---|---|---|
| 2009/0027824 A1* | 1/2009 | Allen | H01H 9/56 361/170 |
| 2009/0167265 A1 | 7/2009 | Vanderzon | |
| 2011/0121752 A1* | 5/2011 | Newman, Jr. | H05B 39/04 315/291 |
| 2012/0074779 A1* | 3/2012 | Black | H02J 3/26 307/31 |
| 2012/0136485 A1* | 5/2012 | Weber | G05B 15/02 700/275 |
| 2013/0163463 A1* | 6/2013 | Grayson | H04L 43/0876 370/253 |

* cited by examiner

DEVICE FOR DETECTING A LOAD TYPE

RELATED APPLICATIONS

This application is related to and claims priority from U.S. Provisional Patent Application Ser. No. 61/590,678, filed Jan. 25, 2012, for "WALL BOX DEVICE FOR AUTOMATICALLY DETECTING THE LOAD TYPE," which is incorporated herein by reference.

TECHNICAL FIELD

The present disclosure relates generally to electronic devices. More specifically, the present disclosure relates to a device for detecting a load type.

BACKGROUND

In recent years, the price of electrical devices has decreased dramatically. In addition, the size of electrical devices has continued to decrease. Further, electrical devices continue to increase in capability and convenience.

Decreasing prices and increasing capabilities of electrical devices has permitted modern devices to be conveniently used in homes and businesses. Many homes and businesses include multiple electrical devices to assist in everyday tasks. While these electronic devices may provide convenience and entertainment, many also require control. Moreover, these electronic devices consume electrical power and may consume other resources. The ever-increasing cost of resources, such as electricity, may be a concern.

With more and more electrical devices being used in homes and businesses that consume more and more electrical power, improved energy management features are needed. As illustrated by this discussion, improved energy management of electrical power consumption may be beneficial.

DETAILED DESCRIPTION

Figure 1:
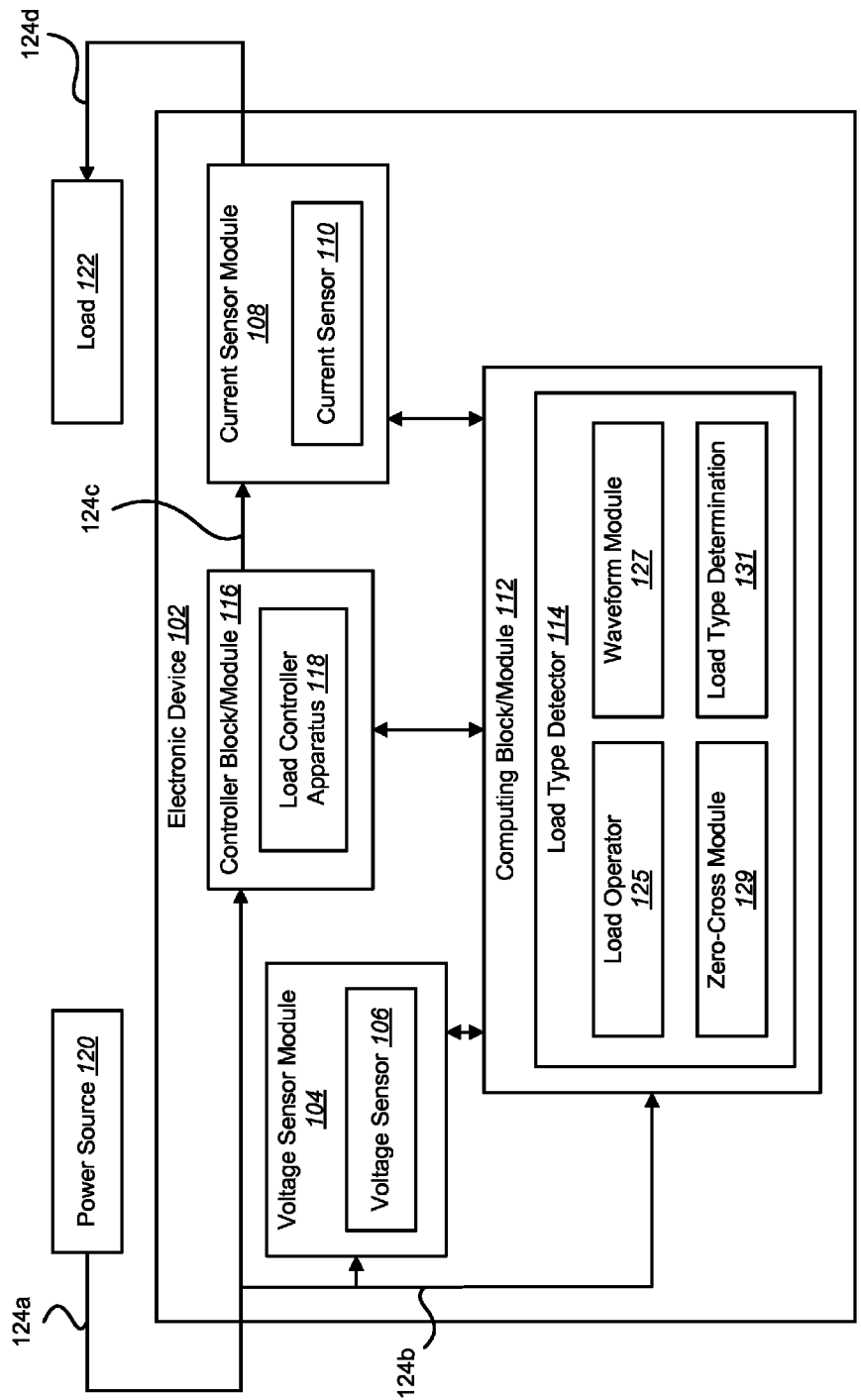
FIG. 1 is a block diagram illustrating one configuration of an electronic device for detecting a load type.

A method for detecting a load type is described. The method includes placing an electronic device in a forward phase mode. The method also includes operating a load at a maximum allowable level. The method further includes capturing a voltage waveform. The method additionally includes capturing a current waveform. The method also includes obtaining a voltage zero-cross based on the voltage waveform. The method further includes obtaining a current zero-cross based on the current waveform. The method additionally includes determining the load type based on the voltage zero-cross and the current zero-cross.

If the current zero-cross is less than the voltage zero-cross, then the load type may be capacitive. If the voltage zero-cross is less than the current zero-cross, then the load type may be inductive.

If the voltage zero-cross equals the current zero-cross, then the method may further include determining whether the electronic device is in a switch-leg mode. If the electronic device is not in a switch-leg mode, then the load type may be resistive.

If the electronic device is in a switch-leg mode, then the method may further include determining whether a slope of the current waveform at the voltage zero-cross is greater than a threshold. If the slope is greater than the threshold, then the load type may be inductive. If the slope is less than the threshold, then the load type may be resistive.

The method may also include determining whether to drive the load connected to the electronic device in a forward phase mode or a reverse phase mode based on the load type. If the load type is inductive, then the load may be driven in the forward phase mode. If the load type is capacitive, then the load may be driven in the reverse phase mode.

An electronic device for detecting a load type is also described. The electronic device includes a voltage sensor module. The voltage sensor module captures a voltage waveform. The electronic device also includes a current sensor module. The current sensor module captures a current waveform. The electronic device additionally includes a computing module coupled to the voltage sensor module and to the current sensor module. The computing module places the electronic device in a forward phase mode. The computing module also operates a load at a maximum allowable level. The computing module further obtains a voltage zero-cross based on the voltage waveform. The computing module additionally obtains a current zero-cross based on the current waveform. The computing module also determines the load type based on the voltage zero-cross and the current zero-cross.

A computer-readable medium comprising executable instructions is also described. The instructions include placing an electronic device in a forward phase mode. The instructions also include operating a load at a maximum allowable level. The instructions further include capturing a voltage waveform. The instructions additionally include capturing a current waveform. The instructions also include obtaining a voltage zero-cross based on the voltage waveform. The instructions further include obtaining a current zero-cross based on the current waveform. The instructions additionally include determining a load type based on the voltage zero-cross and the current zero-cross.

The systems and methods disclosed herein include a device for detecting a load type. For example, an electrical device (e.g., switch, dimmer, etc.) may capture a voltage waveform and a current waveform. The electronic device may determine the load type based on the voltage waveform and the current waveform. In some configurations, the electronic device may be included within a wall box capable of controlling electrical power delivered to a load based on the load type. The load type may be used to determine if the load is driven in a forward (e.g., leading edge) or reverse (e.g., trailing edge) phase.

An electronic device operating according to the systems and methods described herein may have the ability to control an attached load using either forward phase or reverse phase pulse width modulation (PWM). For example, some load types, such as a magnetic transformer attached to one or more 12 volt (V) halogen lights, require forward phase dimming. Other load types, such as an electronic low voltage transformer connected to one or more 12V halogen lights, require reverse phase dimming. Yet other load types, such as incandescent lights, may be dimmed in either forward or reverse phase. Using the wrong mode of control may seriously damage or destroy the load and/or the electronic device itself. Therefore, it may be desirable to determine the load type attached to the electronic device to ensure the proper mode of control is used.

The electronic device (e.g., switch, dimmer, etc.) may control (e.g., drive) a load. Examples of loads include lights, motors, appliances, electronic devices, etc. Examples of types of lights include incandescent, arc, gas discharge, laser, fluorescent, light emitting diode (LED), sulfur, etc. Examples of types of motors include ceiling fan, exhaust fan, pump, etc. Examples of appliances include stoves, refrigerators, heaters, air-conditioners, etc. Examples of electronic devices include computers, televisions, game consoles, wireless devices, semiconductor devices, etc. The load type may determine whether the electronic device functions as a switch and/or dimmer, depending on the capabilities of the load. A load may be characterized as one of three different types of impedances (e.g., load types). Practically speaking, a load includes all three types of impedances. However, in each case, one type of impedance may dominate. The different types of impedances are resistive impedance, inductive impedance and capacitive impedance. For example, motors, electronics, low voltage fans, pumps, gate openers, etc., are inductive loads. Compact fluorescent lights and LED lights, etc., are capacitive loads. Heating elements, etc., are resistive loads.

Various configurations are now described with reference to the figures, where like reference numbers may indicate functionally similar elements. The systems and methods as generally described and illustrated in the figures herein could be arranged and designed in a wide variety of different configurations. Thus, the following more detailed description of several configurations, as represented in the figures, is not intended to limit scope, as claimed, but is merely representative of the systems and methods. As used herein, the term "plurality" may indicate two or more. For example, a plurality of components refers to two or more components.

FIG. 1 is a block diagram illustrating one configuration of an electronic device 102 for detecting a load type. The electronic device 102 may include a voltage sensor module 104, a current sensor module 108, a computing module 112 and a controller module 116. The computing module 112 may be coupled to the voltage sensor module 104 and to the current sensor module 108. The computing module 112 also may be coupled to the controller module 116. In one configuration the electronic device 102 may be housed within a wall box. The electronic device 102 may be coupled to a power source 120 and to a load 122. Examples of electronic devices 102 include electronic circuits, integrated circuits, circuits with discrete components (e.g., resistors, capacitors, transistors, etc.), devices with processors, computers, memory cells, latches, logic gates, etc. In one example, the electronic device 102 is a switch that includes discrete components and a microprocessor that may be used to detect a load type and/or control the load 122. In another example, the electronic device 102 is a dimmer circuit including discrete components and a microprocessor that may be used to detect a load type and/or control the load 122. As used herein, a "module" may be implemented in hardware, software, firmware or any combination thereof.

There are many different load types, but they fall into three basic categories: inductive, capacitive and resistive. Inductive load types typically have a magnetic inductor of some sort. One of the most common examples is a magnetic transformer for low voltage lighting. Inductive load types have a waveform characteristic in which the phase of the current lags (e.g., comes after) the voltage waveform.

Capacitive load types typically have a detectable amount of capacitance. Common examples of a capacitive load type are dimmable fluorescent lights and electronic low voltage lighting. Capacitive load types have a waveform characteristic in which the phase of the current leads (e.g., comes before) the voltage waveform.

Resistive load types typically exhibit the current and voltage in phase with each other. Therefore, there may be no discernible lead or lag between current and voltage in resistive load types.

The current and voltage waveforms may differ significantly if the electronic device 102 is wired in a switch-leg mode or a non-switch-leg mode. In a switch-leg mode (also referred to as series mode), the electronic device 102 may be wired into a circuit without a neutral. As used herein, the terms "switch-leg" and "switch-leg mode" may refer to a wiring configuration where the electronic device 102 is wired in series with the load 122 (without a neutral line available, for example). For example, a hot lead from an electrical panel may be coupled to one lead of the electronic device 102 and the neutral lead and load lead of the electronic device 102 may be coupled to the load 122. In this case, the electronic device 102 may be powered using the return to the load 122. A switch-leg mode may also be referred to as a series mode. Additionally, "non-switch-leg" and "non-switch-leg mode" may refer to configurations where the electronic device is wired in parallel with the load 122 (with a neutral line, for example).

In some configurations, it may be common to have wiring situations where a neutral wire is not available at the location where the electronic device 102 will be installed (e.g., the wall box). In these situations, the electronic device 102 may not be powered in parallel with the hot and neutral alternating current (AC) wires but in series with the hot and load wires. These may be the situations in which the electronic device 102 is wired in switch-leg mode.

It may not be possible to wire a switch in switch-leg mode. Therefore, if the electronic device 102 is wired in switch-leg mode, the electronic device may be a dimmer. It is not possible to operate (e.g., drive) the load 122 connected to the electronic device 102 to a full 100 percent level (e.g., output) in switch-leg mode. Therefore, the electronic device 102 may operate the load 122 at a maximum allowable level for switch-leg mode. In one configuration, the maximum allowable level for switch-leg mode is approximately 55 percent. The voltage waveform may look significantly different in switch-leg mode even when the load 122 is turned off. This may be especially true when the electronic device 102 may be connected to an electronic (e.g., capacitive) low voltage load.

In a non-switch-leg mode, the electronic device 102 may be wired into a circuit with a neutral. In non-switch-leg mode, the electronic device 102 may be driven to a full 100 percent level. Therefore, the maximum allowable level in non-switch-leg mode is 100 percent.

The voltage sensor module 104 may capture a voltage waveform. For example, the voltage sensor module 104 may continuously capture the voltage waveform by sampling the voltage waveform for one or more cycles of AC. The voltage sensor module 104 may include a voltage sensor 106. The voltage sensor module 104 may include discrete components (e.g., resistors, capacitors, transistors, amplifiers, chip packages, etc.). In some configurations, the voltage sensor module 104 may only include discrete components.

The voltage sensor module 104 may capture a continuous time voltage waveform of an alternating current (AC) signal. For example, the voltage sensor module 104 may capture a continuous time voltage waveform of the line feed from the power source 120. The continuous time voltage waveform may represent how the voltage varies over each cycle of the AC signal. In some configurations, the electronic device 102 may use an analog-to-digital (A/D) converter for capturing a discrete time (e.g., digital) voltage waveform of an AC signal by sampling the continuous time voltage waveform captured by the voltage sensor 106. For example, the A/D converter may sample at sufficient intervals to capture how the voltage varies over one or more cycles of the AC signal. The sampling of a voltage waveform is described in more detail below in connection with FIG. 3.

The current sensor module 108 may capture a current waveform. For example, the current sensor module 108 may continuously capture the current waveform by sampling the current waveform for one or more cycles of AC. The current sensor module 108 may include a current sensor 110. The current sensor module 108 may include discrete components. In some configurations, the current sensor module 108 may only include discrete components.

The current sensor 110 may capture a continuous time current waveform of an AC signal. For example, the current sensor 110 may capture a continuous time current waveform of the current to the load 122. The continuous time current waveform may capture how the current varies over each cycle of the AC signal. The sampling of a current waveform is described in more detail below in connection with FIG. 4.

In some configurations, the electronic device 102 may additionally include an analog-to-digital (A/D) converter for capturing a discrete time (e.g., digital) current waveform of an AC signal by sampling the continuous time current waveform captured by the current sensor 110. For example, the A/D converter may sample at sufficient intervals to capture how the current varies over one or more cycles of the AC signal. The A/D converter may sample the current waveform to correspond to the sampling of the voltage waveform. Depending on the impedance of the circuit (e.g., the electronic device 102 and the load 122), there may be a phase shift between the voltage waveform and the current waveform.

The computing module 112 may direct the operation of the electronic device 102. For example, the computing module 112 may include a microprocessor and memory for controlling the electronic device 102. In one configuration, the computing module 112 may include a load type detector module 114 to implement load type detection. The load type detector module 114 may include a load operator module 125, a waveform module 127, a zero-cross module 129 and a load type determination module 131. In some configurations, the load type detector module 114 may periodically detect the load type. For example, each time the electronic device 102 power cycles, the load type detector module 114 may detect the load type.

Upon initiation of a load type detection, the load operator module 125 may place the electronic device 102 in a forward phase mode (e.g., the load 122 is driven in forward phase). The load operator module 125 may operate the load 122 at the maximum allowable level based on whether the electronic device 102 is in a switch-leg mode or non-switch-leg mode. In one configuration, the load operator module 125 may issue commands to a controller module 116 (discussed below) to operate the load 122 in a forward phase mode at the maximum allowable level. If the electronic device 102 is in a non-switch-leg mode, the load operator module 125 may operate the load 122 at 100 percent. If the electronic device 102 is in a switch-leg mode, the load operator module 125 may operate the load 122 at approximately 55 percent.

The waveform module 127 may receive the voltage waveform and the current waveform. For example, the waveform module 127 may receive the voltage waveform from the voltage sensor module 104 as a series of voltage data samples. The voltage waveform (e.g., voltage data samples) may be placed in memory. The waveform module 127 may also receive the current waveform from the current sensor module 108 as a series of current data samples. The current waveform (e.g., current data samples) may be placed in memory. The waveform module 127 may receive the voltage waveform and current waveform concurrently.

The zero-cross module 129 may obtain a voltage zero-cross and a current zero-cross. For example, the voltage zero-cross may be based on the voltage waveform and the current zero-cross may be based on current waveform. For the voltage zero-cross, the zero-cross module 129 may determine the time (e.g., position) where the voltage crosses a zero point. In other words, the zero-cross module 129 may determine the time when the value of the voltage is zero as described in more detail below in connection with FIG. 5. The time when the value of the voltage is zero may be the voltage zero-cross.

For the current zero-cross, the zero-cross module 129 may determine the time (e.g., position) where the current crosses the zero point. In other words, the zero-cross module 129 may determine the time when the current is zero following a time when the current is non-zero for a measurable duration as described in more detail below in connection with FIG. 6. The time when the value of the current is zero following an earlier time where the current is non-zero for a measurable duration may be the current zero-cross.

The load type determination module 131 may determine the load type based on the voltage zero-cross and the current zero-cross. For example, if the load type determination module 131 determines that the current zero-cross is less than the voltage zero-cross, then the load 122 is a capacitive load type. In this case, the time associated with the current zero-cross is less than the time associated with the voltage zero-cross. In other words, if the current zero-cross leads the voltage zero-cross, then the load 122 has capacitive impedance.

If the load type determination module 131 determines that the voltage zero-cross is less than the current zero-cross, then the load 122 is an inductive load type. In this case, the time associated with the voltage zero-cross is less than the time associated with the current zero-cross. In other words, if the voltage zero-cross leads the current zero-cross, then the load 122 has inductive impedance.

If the load type determination module 131 determines that the voltage zero-cross is equal to (or within a range of) the current zero-cross, then the load type determination module 131 may perform further analysis to determine the load type based on whether the electronic device 102 is in a switch-leg mode. It should be noted that if the value of the voltage zero-cross is within a specified range of the value of the current zero-cross, the load type determination module 131 may treat the voltage zero-cross (time) and current zero-cross (time) as equal. For example, if the voltage zero-cross is within one or more threshold or tolerance amounts of time or time samples of the current zero-cross (leading and/or lagging), the voltage zero-cross and the current zero-cross may be deemed equal for the purposes of the systems and methods disclosed herein. If the electronic device 102 is not in a switch-leg mode and the voltage zero-cross is equal to the current zero-cross, then the load 122 is a resistive load type. However, if the electronic device 102 is in a switch-leg mode and the voltage zero-cross is equal to the current zero-cross, then the load type determination module 131 may calculate the slope of the current waveform at the voltage zero-cross or the current zero-cross. If the slope of the current waveform at the voltage zero-cross is greater than a threshold, then the load 122 is an inductive load type. However, if the slope of the current waveform at the voltage zero-cross is less than a threshold, then the load 122 is a resistive load type.

The load type detector 114 may adapt how the electronic device 102 drives the load based on the type of the load 122 (e.g., the type of impedance of the load). For example, the electronic device 102 may adjust the way it drives the load 122 (e.g., adjust the voltage waveform and/or current waveform) and/or adjust its own impedance to improve the efficiency (e.g., power factor) for the circuit. Thus, the electronic device 102 may determine the load type to enhance the efficiency of the circuit.

The electronic device 102 may determine how the load is driven based on the load type. Determining how the load is driven may include determining whether to drive the load 122 connected to the electronic device 102 in a forward phase mode or a reverse phase mode based on the load type. For example, the load type detector 114 may adjust the driving voltage waveform and/or current waveform to enhance efficiency (e.g., increase the power factor by adjusting the phase margin). For example, the electronic device 102 may be coupled to an inductive impedance (e.g., ceiling fan). In this case, the load type detector 114 may increase the capacitive impedance of the electronic device 102 to reduce the phase margin and thus increase the power factor of the circuit. In another example, the electronic device 102 may be coupled to a capacitive impedance (e.g., compact fluorescent lamp). In this case, the load type detector 114 may increase the inductance of the electronic device 102 to reduce the phase margin and thus increase the power factor of the circuit. If the electronic device 102 is configured as an electronic dimmer, the load type detector 114 may additionally or alternatively adjust the duty cycle and/or the amount of power delivered to the load 122 to enhance efficiency (e.g., limiting the watts provided to correspond with the watts consumed).

The controller module 116 may control the amount of power delivered to the load 122. In one configuration (e.g., switch), the control module 116 may turn on (e.g., enable) the power or turn off (e.g., disable) the power to the load 122. In another configuration (e.g., dimmer), the controller module 116 may adjust the amount of power that is delivered to the load 122 (e.g., enable, disable, adjust duty cycle, etc.). The controller module 116 may include a load controller apparatus 118 for switching and/or dimming the power delivered to the load 122. Examples of load controller apparatus 118 include switches (e.g., mechanical relay, solid state relay, etc.) and dimmers (e.g., MOSFET, TRIAC, transistor, etc.). The controller module 116 may include discrete components. In some configurations, the controller module 116 may only include discrete components.

The power source 120 may output high voltage (e.g., 240, 120) AC. The high voltage AC may be coupled to electronic device 102 through feed line 124a-c. The load 122 may be coupled to the electronic device 102 through feed line 124d. The current sensor 110 may be in line with the feed line 124c and 124d so that the load current may be determined.

In some configurations, the electronic device 102 may be housed in a wall box. For example, the electronic device 102 may be configured to be contained within a wall box as an electrical device. A wall box (e.g., electrical box, outlet box, switch box, pattress, etc.) is the container for the body of an electrical device (e.g., light switch, power outlet). While housed in the wall box, the face of the electrical device is flush with a wall. In general, the width of a wall box is measured in "gangs," which indicates the number of electrical devices (e.g., light switch, power outlet) that the wall box can hold. For example, a single-gang wall box can hold a single electrical device (e.g., light switch, power outlet) and a double-gang wall box can hold two electrical devices (e.g., light switch, power outlet) side by side. The depth of a wall box may be standard depth, shallow depth, or deep depth. For purposes of the systems and methods disclosed herein, a wall box is a single-gang standard depth wall box and a wall box device is an electronic device 102 that may be held in a single-gang standard depth wall box. In one configuration, a European style wall box having a width of 86 millimeters, a height of 86 millimeters and a depth of 35 millimeters may be used. In another configuration, a United States style, single-gang, standard depth wall box may be used.

A wall box switch is one example of an electronic device 102 with two discrete states that may be used to control a load 122. A wall box switch may be in an "off" state or in an "on" state. Thus, a wall box switch may turn on or off electrical power to the load 122. In one configuration, a wall box switch may use a relay (e.g., mechanical, solid state, etc.) to turn on or off electrical power to the load 122. A simple example of a wall box switch is a light switch that turns on or off electrical power to a light. The light switch may turn on the light by turning on electrical power to the light or turn off the light by turning off electrical power to the light.

A wall box dimmer is another example of an electronic device 102 with variable states that may be used to control a load 122. A wall box dimmer may variably adjust the amount of electrical power that is driven to the load 122 (e.g., by adjusting the root mean square (RMS) voltage, adjusting pulse-width modulation, adjusting duty cycle, etc.). For example, a wall box dimmer may provide 0% electrical power, 100% electrical power or some percentage in between.

In one configuration, a wall box dimmer may use a semiconductor (e.g., metal-oxide-semiconductor field-effect transistor (MOSFET), triode for alternating current (TRIAC), transistors, etc.) to control the load. A simple example of a wall box dimmer is a light dimmer that may turn on or off and variably control the brightness of a light. For example, the light dimmer may increase the brightness of the light by increasing the amount of electrical power driven to the light. Similarly, the light dimmer may decrease the brightness of the light by decreasing the amount of electrical power driven to the light. In some configurations, the wall box device may include switching and dimming capabilities.

Figure 2:
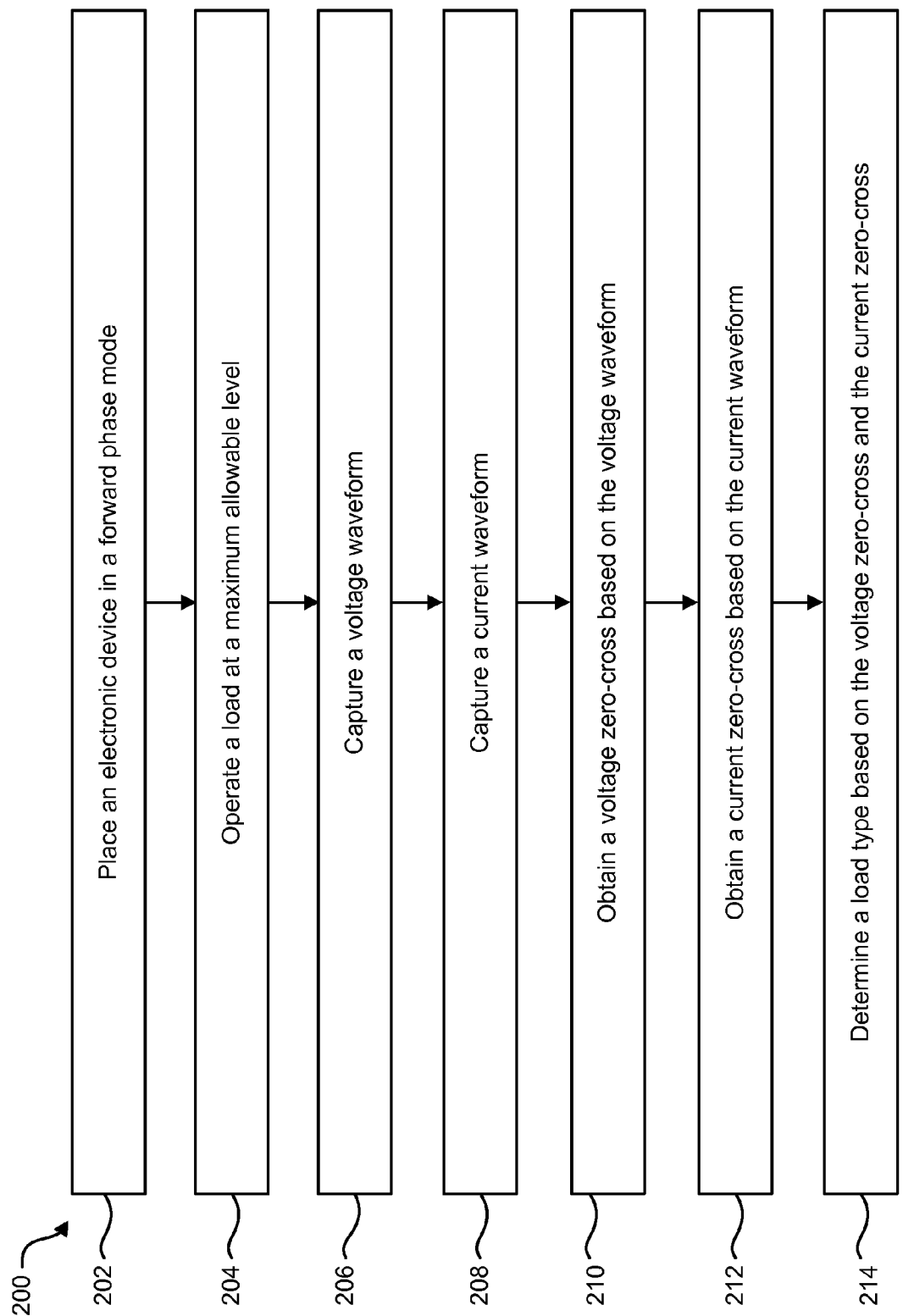
FIG. 2 is a flow diagram illustrating one configuration of a method for detecting a load type with an electronic device.

FIG. 2 is a flow diagram illustrating one configuration of a method 200 for detecting a load type with an electronic device 102. The electronic device 102 may be placed 202 in a forward phase mode. For example, in the forward phase mode, a load 122 may be driven in a forward phase. The electronic device 102 may be placed 202 in the forward phase mode for the duration of the load type detection.

The electronic device 102 may operate 204 the load 122 at a maximum allowable level. For example, the maximum allowable level may be based on whether the electronic device 102 is in a switch-leg mode or non-switch-leg mode. In one configuration, the electronic device 102 may issue commands to a controller module 116 to operate 204 the load 122 in a forward phase mode at the maximum allowable level. If the electronic device 102 is in a non-switch-leg mode, the electronic device 102 may operate 204 the load 122 at 100 percent. If the electronic device 102 is in a switch-leg mode, electronic device 102 may operate 204 the load 122 at approximately 55 percent.

The electronic device 102 may capture 206 a voltage waveform. For example, the electronic device 102 may capture 206 the voltage waveform as a series of voltage data samples. In some configurations, the electronic device 102 may include a voltage sensor 106 that may capture 206 the voltage waveform. The voltage waveform may include the measured voltage of line feed from the power source 120 at discrete time increments.

The electronic device 102 may capture 208 a current waveform. For example, the electronic device 102 may capture 208 the current waveform as a series of current data samples. In some configurations, the electronic device 102 may include a current sensor 110 that may capture 208 the current waveform. The current waveform may include the measured current to the load 122 at discrete time increments. It should be noted that capturing 206 the voltage waveform and capturing 208 the current waveform are shown sequentially in FIG. 2. However, the electronic device 102 may capture 206, 208 the voltage waveform and current waveform concurrently.

The electronic device 102 may obtain 210 a voltage zero-cross based on the voltage waveform. For example, the electronic device 102 may determine the time (e.g., position) where the voltage crosses the zero point. In other words, the electronic device 102 may determine the time when the value of the voltage is zero. The time when the value of the voltage is zero may be the voltage zero-cross.

The electronic device 102 may obtain 212 a current zero-cross based on the current waveform. For example, the electronic device 102 may determine the time (e.g., position) where the current crosses the zero point. In other words, the electronic device 102 may determine the time when the current is zero following an earlier time when the current is non-zero for a measurable duration. The time when the value of the current is zero following the earlier time where the current is non-zero for a measurable duration may be the current zero-cross.

The electronic device 102 may determine 214 a load type based on the voltage zero-cross and the current zero-cross. For example, the electronic device 102 may compare the voltage zero-cross and the current zero-cross. Based on whether the voltage zero-cross is less than, greater than or equal to the current zero-cross, the electronic device 102 may determine whether the load 122 is a capacitive load type, inductive load type or resistive load type. The load type determination 214 may further be based on whether the electronic device 102 is in a switch-leg mode. The load type determination 214 is discussed in more detail below in connection with FIG. 7.

Figure 3:
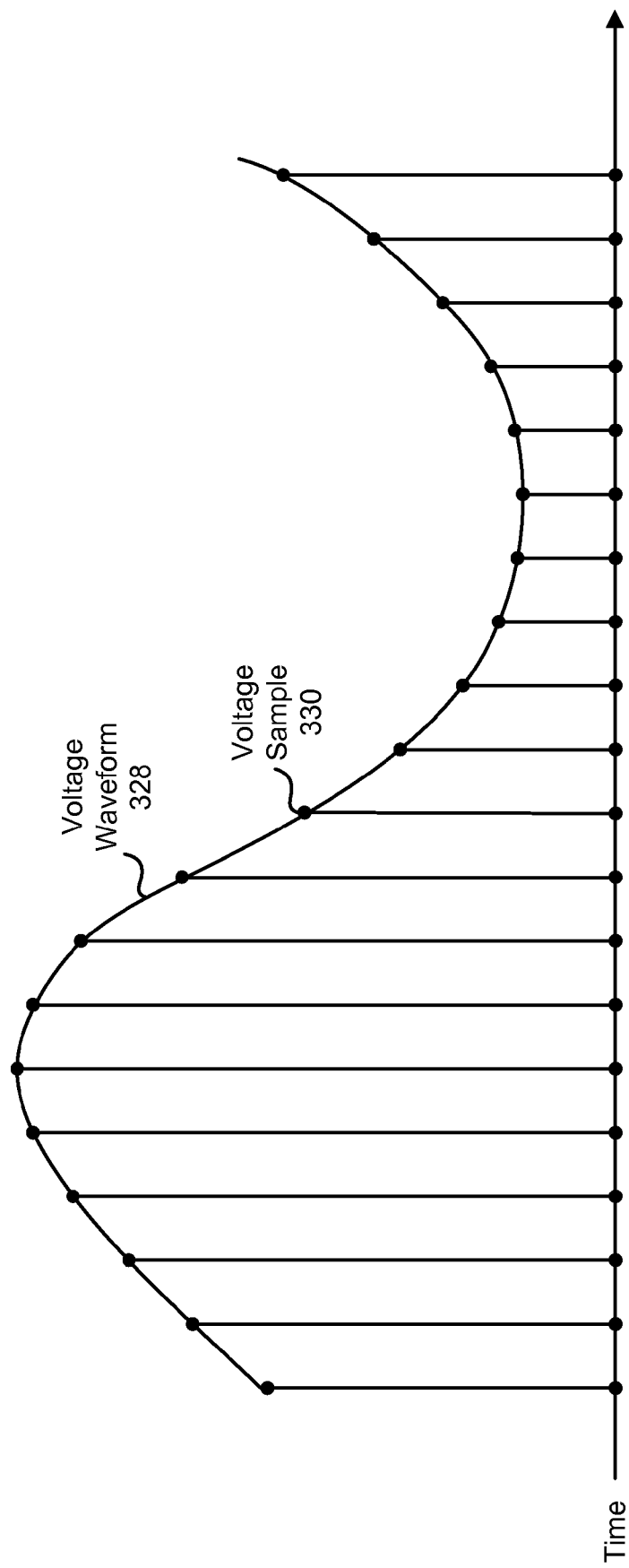
FIG. 3 illustrates an example of a voltage waveform.

FIG. 3 illustrates an example of a voltage waveform 328. The voltage waveform 328 may correspond to a continuous alternating current (AC) signal. The voltage waveform 328 may be captured by sampling the continuous AC signal to produce a discrete (e.g., digital) signal. For example, the voltage waveform 328 may include multiple voltage samples 330. Each voltage sample 330 may correspond to a voltage amplitude measured at discrete time intervals. Therefore, each voltage sample 330 may be associated with a particular voltage amplitude and a particular time.

In one configuration, the voltage waveform 328 may be captured by the electronic device 102 as described above in connection with FIG. 1. For example, a voltage sensor 106 may continuously capture the voltage waveform 328 by sampling the voltage waveform 328 for one or more cycles of AC. The voltage sensor 106 may capture a continuous time voltage waveform 328 of the line feed from the power source 120. The electronic device 102 may use an analog-to-digital (A/D) converter for capturing a discrete time (e.g., digital) voltage waveform 328 of the AC signal by sampling the continuous time voltage waveform 328 captured by the voltage sensor 106. Additionally, the electronic device 102 may place the voltage samples 330 in memory for use in detecting a load type. In one configuration, a computing module 112 may include a set of program instructions for utilizing the voltage sensor 106 to capture the voltage waveform 328.

Figure 4:
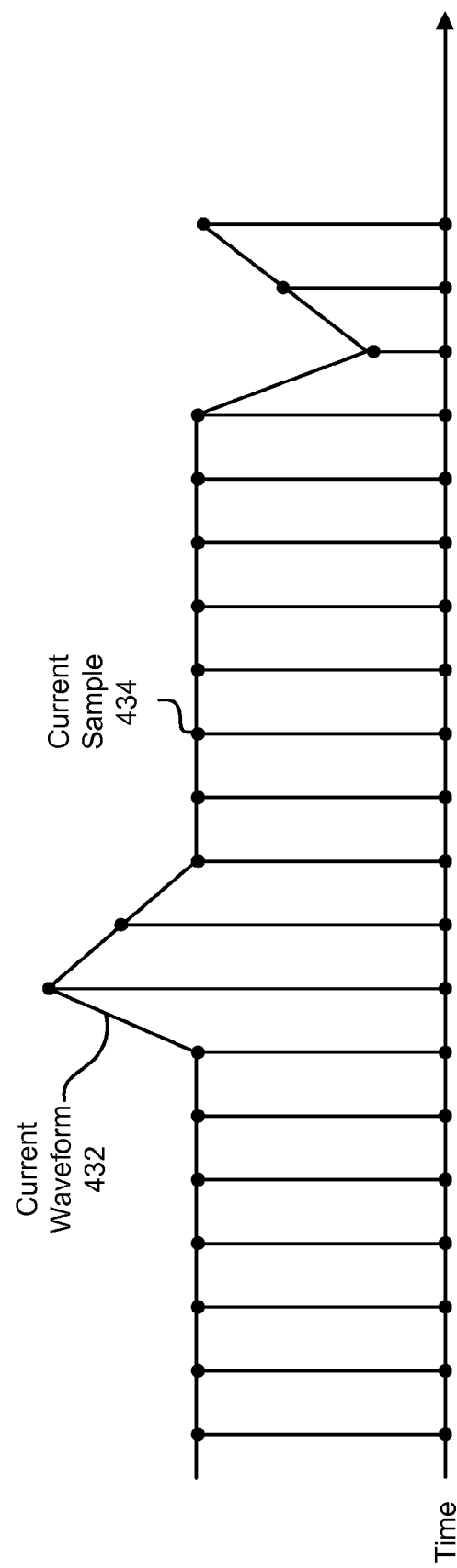
FIG. 4 illustrates an example of a current waveform.

FIG. 4 illustrates an example of a current waveform 432. The current waveform 432 may correspond to a continuous alternating current (AC) signal. The current waveform 432 may be captured by sampling the continuous AC signal to produce a discrete (e.g., digital) signal. For example, the current waveform 432 may include multiple current samples 434. Each current sample 434 may correspond to current amplitude measured at discrete time intervals. Therefore, each current sample 434 may be associated with a particular current amplitude and a particular time.

In one configuration, the current waveform 432 may be captured by the electronic device 102 as described above in connection with FIG. 1. For example, a current sensor 110 may continuously capture the current waveform 432 by sampling the current waveform 432 for one or more cycles of AC. The current sensor 110 may capture a continuous time current waveform 432 of the current to the load 122. The electronic device 102 may use an analog-to-digital (A/D) converter for capturing a discrete time (e.g., digital) current waveform 432 of the AC signal by sampling the continuous time current waveform 432 captured by the current sensor 110. Additionally, the electronic device 102 may place the current samples 434 in memory for use in detecting a load type. In one configuration, a computing module 112 may include a set of program instructions for utilizing the current sensor 110 to capture the current waveform 432.

Figure 5:
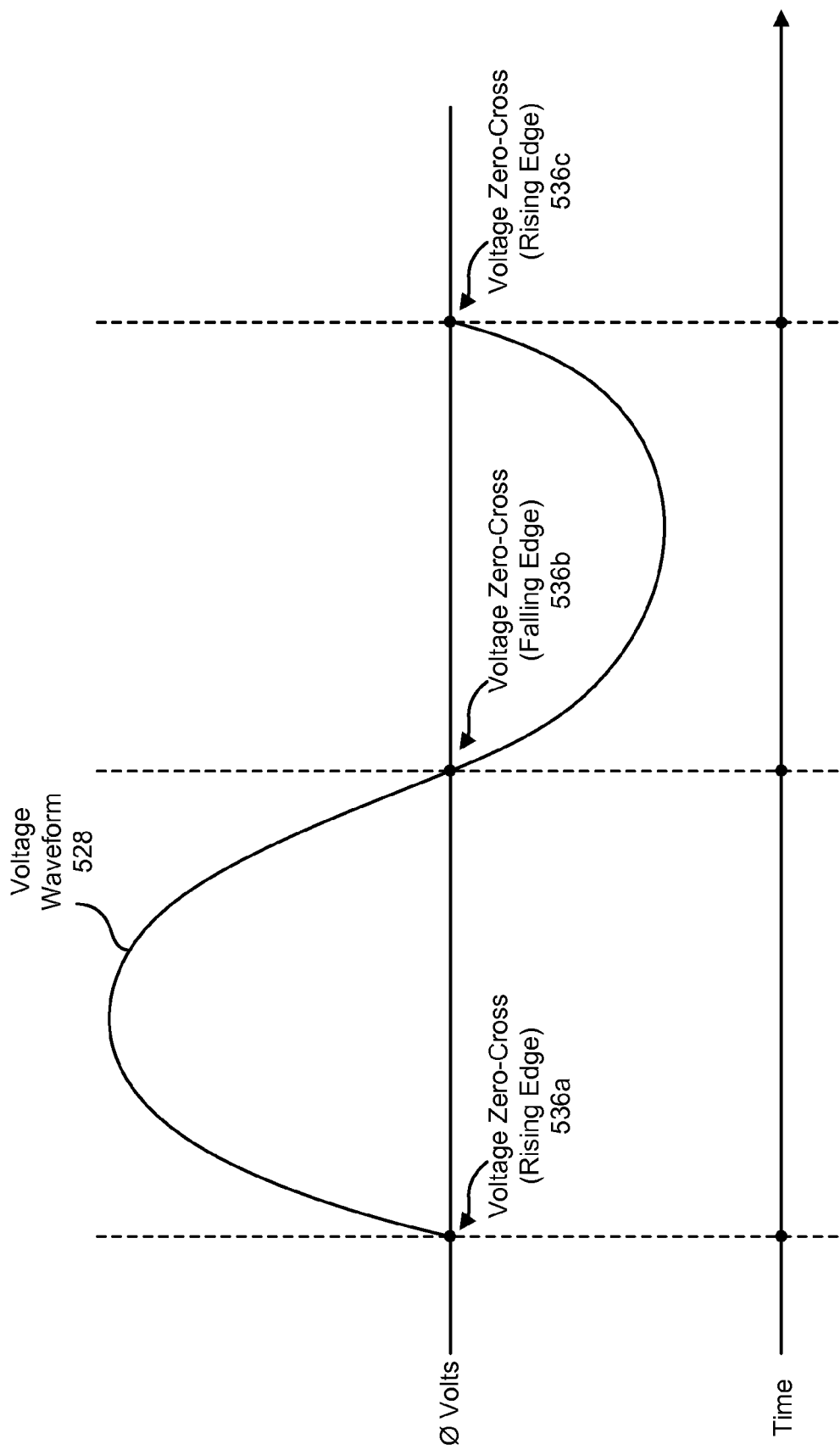
FIG. 5 illustrates multiple examples of voltage zero-crosses associated with a voltage waveform.

FIG. 5 illustrates multiple examples of voltage zero-crosses 536 associated with a voltage waveform 528. The voltage waveform 528 may correspond to an alternating current (AC) signal. As the polarity of the AC signal alternates between positive and negative over an AC cycle, the voltage waveform 528 will cross a zero-point where the value of the voltage is zero. The time corresponding to the point when the value of the voltage is zero is the voltage zero-cross 536. If the voltage is increasing when the voltage waveform 528 crosses the zero-point, the voltage zero-cross 536 is a rising edge voltage zero-cross 536a, c. If the voltage is decreasing when the voltage waveform 528 crosses the zero-point, the voltage zero-cross 536 is a falling edge voltage zero-cross 536b.

The voltage waveform 528 may be captured by sampling the continuous AC signal to produce a discrete (e.g., digital) signal as described above in connection with FIG. 3. The sampled voltage waveform 528 may be stored in memory. The electronic device 102 may obtain the voltage zero-cross 536 based on the sampled voltage waveform 528. For example, the electronic device 102 may determine when the value of the voltage changes sign (e.g., from positive to negative). The time associated with the voltage sample 330 following the change in voltage sign may be the voltage zero-cross 536. Additionally or alternatively, the electronic device 102 may include a simple AC circuit that produces a pulse each time the voltage waveform 528 crosses zero volts in some configurations.

Figure 6:
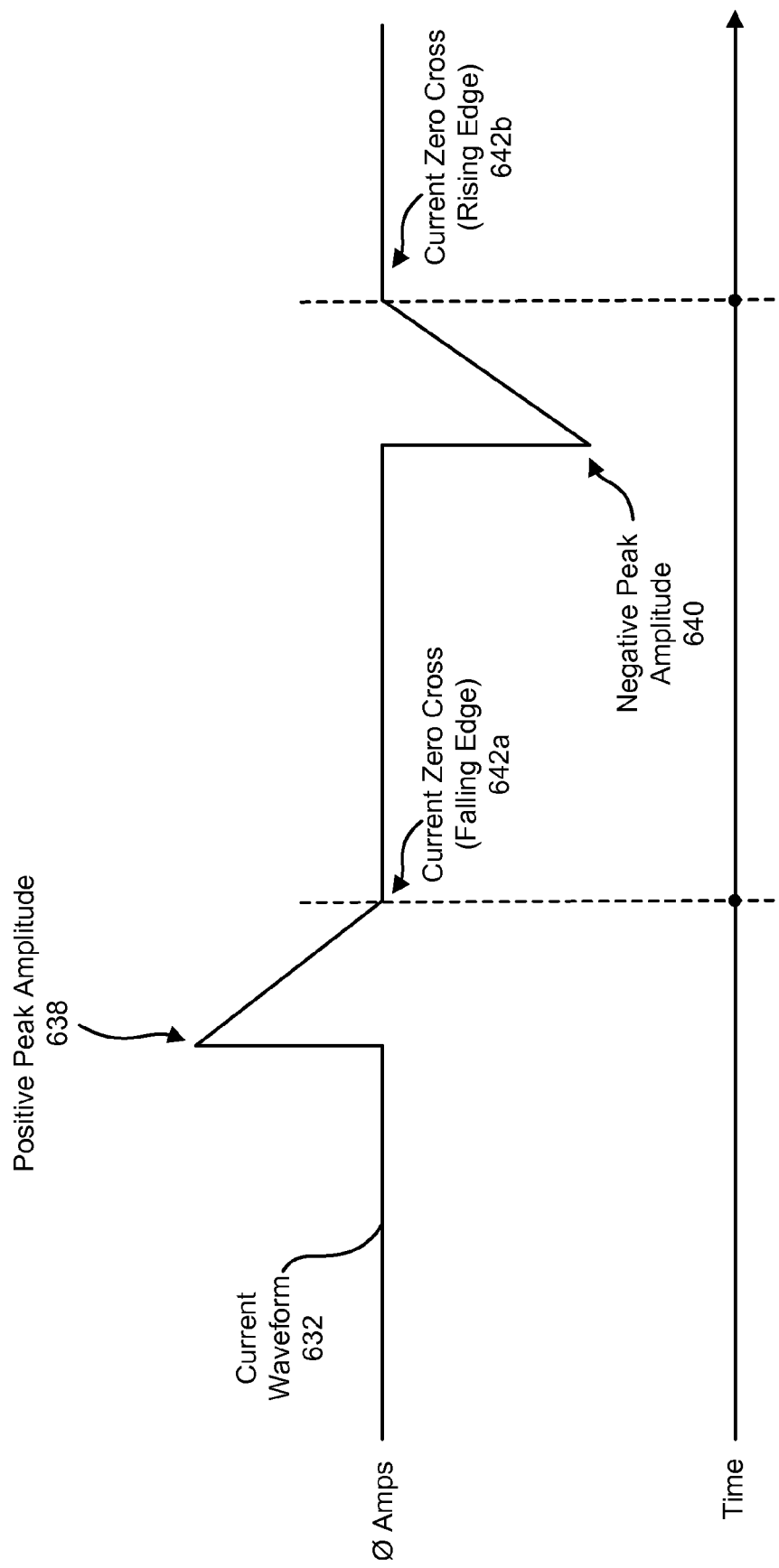
FIG. 6 illustrates multiple examples of current zero-crosses associated with a current waveform.

FIG. 6 illustrates multiple examples of current zero-crosses 642 associated with a current waveform 632. The current waveform 632 may correspond to an alternating current (AC) signal. As the polarity of the AC signal alternates between positive and negative over an AC cycle, the current waveform 632 will also alternate between positive and negative values. The current zero-cross 642 occurs at the time where the current is zero following an earlier point where the current is non-zero for a measurable duration. Therefore, the current zero-cross 642 may be the first point when the amplitude of the current is zero following a peak (positive or negative) current amplitude. For example, in FIG. 6, the value of the current is initially zero and then rises to a positive peak amplitude 638 and decreases to zero amps. In this example, the current zero-cross 642a is the first time when the current equals zero after rising to the measurable positive peak amplitude 638. If the current is decreasing (from a positive peak amplitude 638, for instance) when the current waveform 632 equals zero, the current zero-cross 642 is a falling edge current zero-cross 642a. If the current is increasing (from a negative peak amplitude 640, for instance) when the current waveform 632 equals zero, the current zero-cross 642 is a rising edge current zero-cross 642b.

The current waveform 632 may be captured by sampling the continuous AC signal to produce a discrete (e.g., digital) signal as described above in connection with FIG. 5. The sampled current waveform 632 may be stored in memory. The electronic device 102 may obtain the current zero-cross 642 based on the sampled current waveform 632. For example, the electronic device 102 may determine when the value of the current initially changes from zero to non-zero. The electronic device 102 may then determine when the current reaches zero again. The time associated with the current reaching zero may be the current zero-cross 642. In some configurations, the electronic device 102 may utilize an analog-to-digital converter (ADC) to capture the current waveform and determine the current zero-cross 642.

Figure 7:
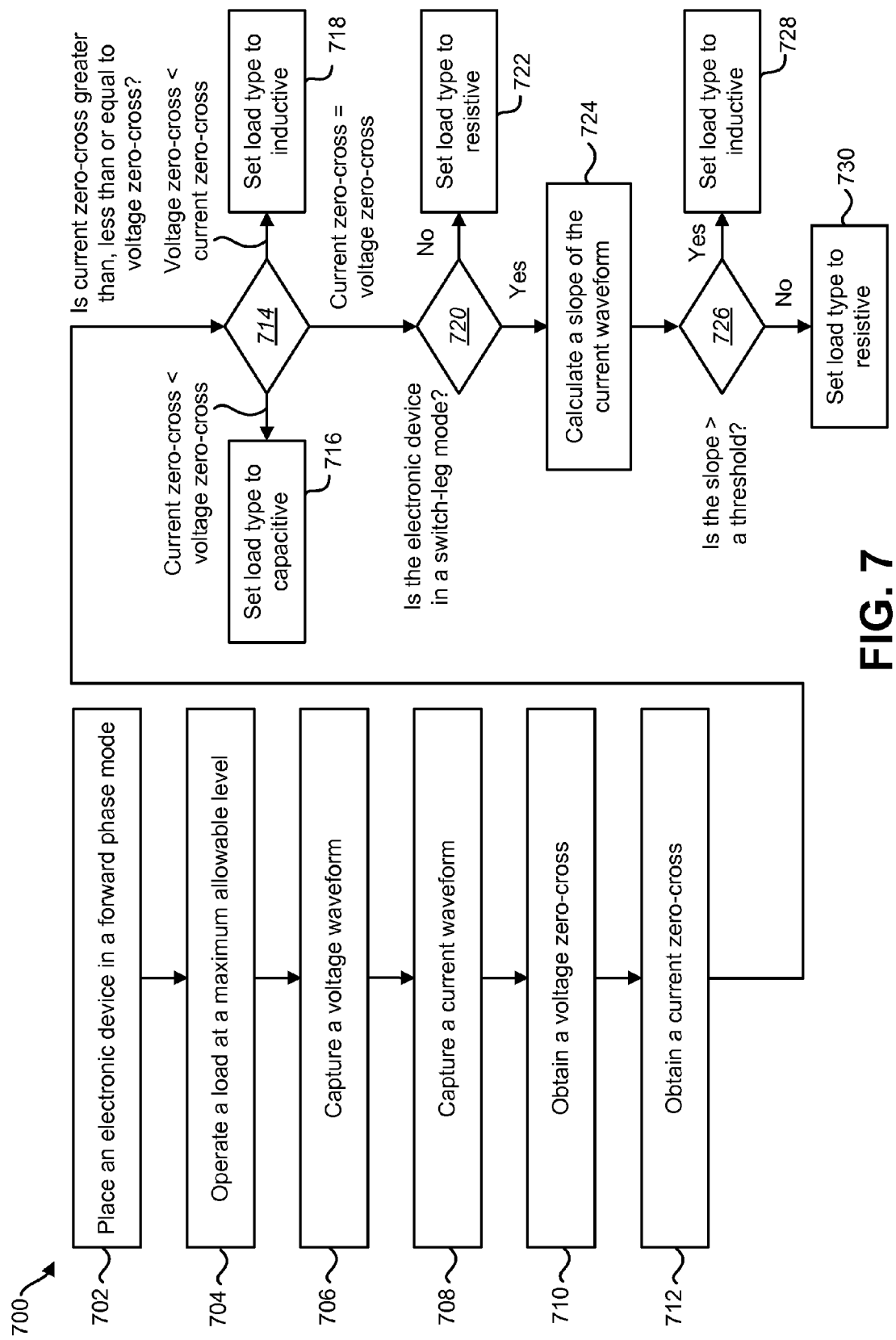
FIG. 7 is a flow diagram illustrating a more detailed configuration of a method for detecting a load type with an electronic device.

FIG. 7 is a flow diagram illustrating a more detailed configuration of a method 700 for detecting a load type with an electronic device 102. The electronic device 102 may be placed 702 in a forward phase mode. This may be accomplished as described above in connection with FIG. 2.

The electronic device 102 may operate 704 the load 122 at a maximum allowable level. This may be accomplished as described above in connection with FIG. 2.

The electronic device 102 may capture 706 a voltage waveform 328. This may be accomplished as described above in connection with FIG. 2.

The electronic device 102 may capture 708 a current waveform 432. This may be accomplished as described above in connection with FIG. 2.

The electronic device 102 may obtain 710 a voltage zero-cross 536 based on the voltage waveform 328. This may be accomplished as described above in connection with FIG. 2.

The electronic device 102 may obtain 712 a current zero-cross 642 based on the current waveform 432. This may be accomplished as described above in connection with FIG. 2.

The electronic device 102 may determine 714 whether the voltage zero-cross 536 (time) is greater than, less than or equal to the current zero-cross 642 (time). For example, if the current zero-cross 642 is less than the voltage zero-cross 536, then the load 122 is a capacitive load type. In this case, the time associated with the current zero-cross 642 is less than the time associated with the voltage zero-cross 536. In other words, because the current zero-cross 642 leads the voltage zero-cross 536, the load 122 has capacitive impedance. In this case, the electronic device 102 may set 716 the load type to capacitive. For example, the electronic device 102 may set 716 a load type value to capacitive and store the load type value in memory. Examples of waveforms corresponding to this case (e.g., capacitive/switch-leg mode and capacitive/non-switch-leg mode) are illustrated below in FIG. 8 and FIG. 9.

If the voltage zero-cross 536 is less than the current zero-cross 642, then the load 122 is an inductive load type. In this case, the time associated with the voltage zero-cross 536 is less than the time associated with the current zero-cross 642. In other words, because the voltage zero-cross 536 leads the current zero-cross 642 the load 122 has inductive impedance. In this case, the electronic device 102 may set 718 the load type to inductive. For example, the electronic device 102 may set 718 a load type value to inductive and store the load type value in memory. An example of waveforms corresponding to this case (e.g., inductive/non-switch-leg mode) is illustrated below in FIG. 10.

If the voltage zero-cross 536 is equal to (or within a range of) the current zero-cross 642, then the electronic device 102 may determine 720 whether the electronic device 102 is in a switch-leg mode. If the electronic device 102 is not in a switch-leg mode, then the load 122 is a resistive load type. In this case, the voltage and the current are in phase and the time associated with the voltage zero-cross 536 equals the time associated with the current zero-cross 642. The electronic device 102 may set 722 the load type to resistive. For example, the electronic device 102 may set 722 a load type value to resistive and store the load type value in memory. An example of waveforms corresponding to this case (e.g., resistive/non-switch-leg mode) is illustrated below in FIG. 11.

If the electronic device 102 determines 720 that the electronic device 102 is in a switch-leg mode, then the electronic device 102 may calculate 724 the slope of the current waveform 432. In some configurations, this may be accomplished by digitizing the current waveform 432 and comparing adjacent values of the current waveform 432 to calculate the slope. The slope may be calculated 724 at one of the zero-crosses. Because the voltage zero-cross 536 and the current zero-cross 642 are equal in this case, the slope may be calculated 724 at the voltage zero-cross 536 or the current zero-cross 642.

The electronic device 102 may determine 726 whether the slope is greater than a threshold. The threshold may be specified and stored in the electronic device 102. If the slope is greater than the threshold, then the load 122 is an inductive load type. The electronic device 102 may set 728 the load type to inductive. For example, the electronic device 102 may set 728 a load type value to inductive and store the load type value in memory. An example of waveforms corresponding to this case (e.g., inductive/switch-leg mode) is illustrated below in FIG. 12.

However, if the electronic device 102 determines 726 that the slope of the current waveform at the voltage zero-cross is not greater than the threshold, then the load 122 is a resistive load type. The electronic device 102 may set 730 the load type to resistive. For example, the electronic device 102 may set 730 a load type value to resistive and store the load type value in memory. An example of waveforms corresponding to this case (e.g., resistive/switch-leg mode) is illustrated below in FIG. 13.

It should be noted that to increase reliability, several sequences of samples (of the voltage waveform 328 and the current waveform 432) may be taken and analyzed. Performing multiple iterations of the load type determination (at different times) may decrease the possibility of misdetection due to transient events such as noise on the AC line.

Figure 8:
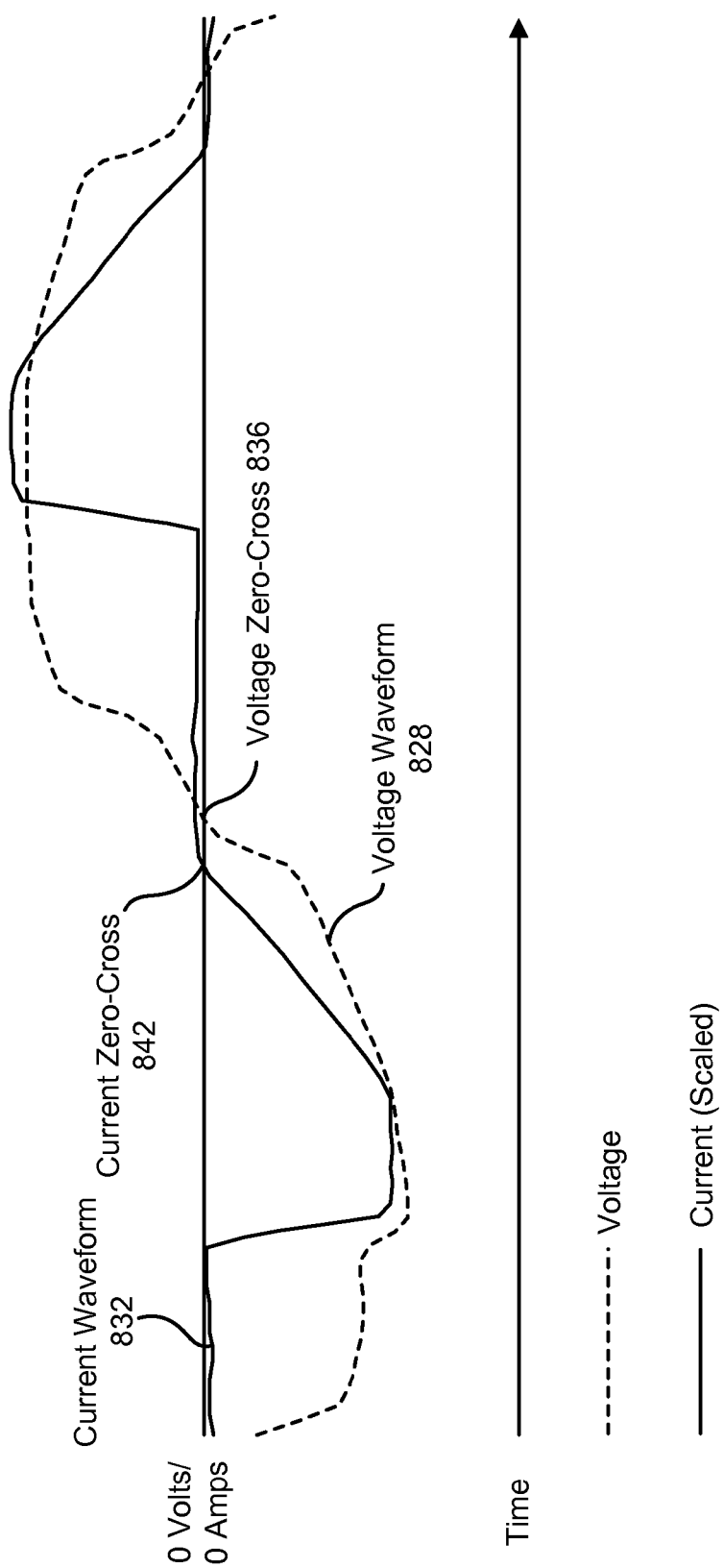
FIG. 8 illustrates a voltage waveform and a current waveform associated with a capacitive load type in a switch-leg mode.

FIG. 8 illustrates a voltage waveform 828 and a current waveform 832 associated with a capacitive load type in a switch-leg mode. Capacitive loads 122 (e.g., electronic loads 122) show a characteristic waveform even when wired in switch-leg mode (e.g., without a neutral line). It should be noted that in this case (e.g., switch-leg mode) it is not possible to drive the output at 100 percent. Therefore, the maximum allowable level to operate a load 122 may be approximately 55 percent.

In this example, a capacitive load (e.g., an electronic low voltage load) 122 is wired in switch-leg mode. The voltage waveform 828 and current waveform 832 may be captured as described above in connection with FIG. 1. The current zero-cross 842 is less than the voltage zero-cross 836. In other words, the current leads the voltage at the point voltage equals zero. It should be noted that the voltage waveform 828 is not purely sinusoidal. This may be a side effect of the electronic device 102 being wired in switch-leg mode. The electronic load 122 may disturb the voltage measurement as it uses voltage to drive itself.

Figure 9:
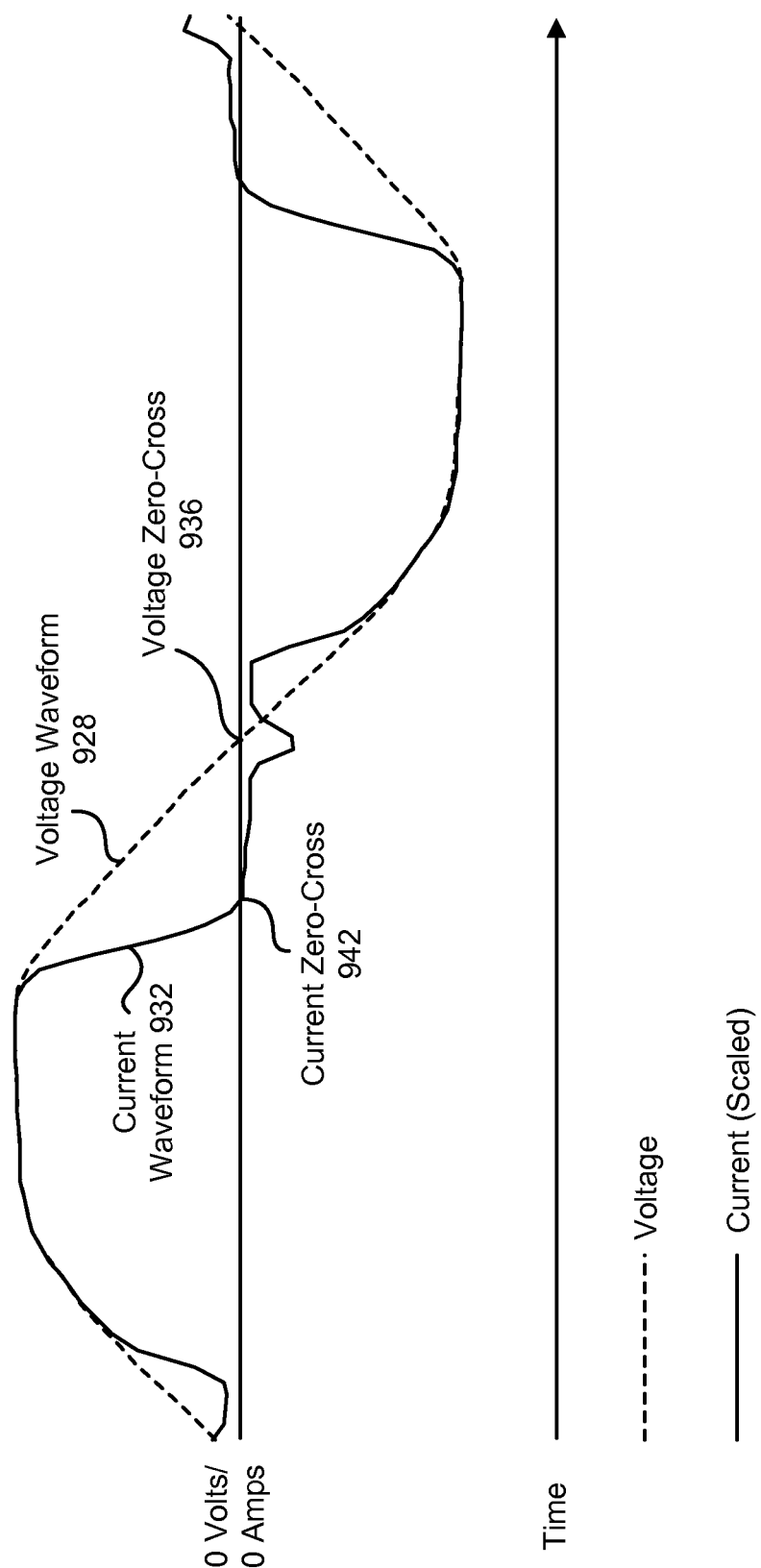
FIG. 9 illustrates a voltage waveform and a current waveform associated with a capacitive load type in a non-switch-leg mode.

FIG. 9 illustrates a voltage waveform 928 and a current waveform 932 associated with a capacitive load type in a non-switch-leg mode. It should be noted that in this case (e.g., non-switch-leg mode) it is possible to drive the output at 100 percent. Therefore, the maximum allowable level to operate a load 122 may be 100 percent.

In this example, a capacitive load (e.g., an electronic low voltage load) 122 is wired in non-switch-leg mode (e.g., in normal mode with a neutral line). The voltage waveform 928 and current waveform 932 may be captured as described above in connection with FIG. 1. When driving a capacitive load 122 at 100 percent in non-switch-leg mode, the current is expected to lead the voltage. In this example, the current zero-cross 942 is less than the voltage zero-cross 936. In other words, the current leads the voltage at the point voltage equals zero.

Figure 10:
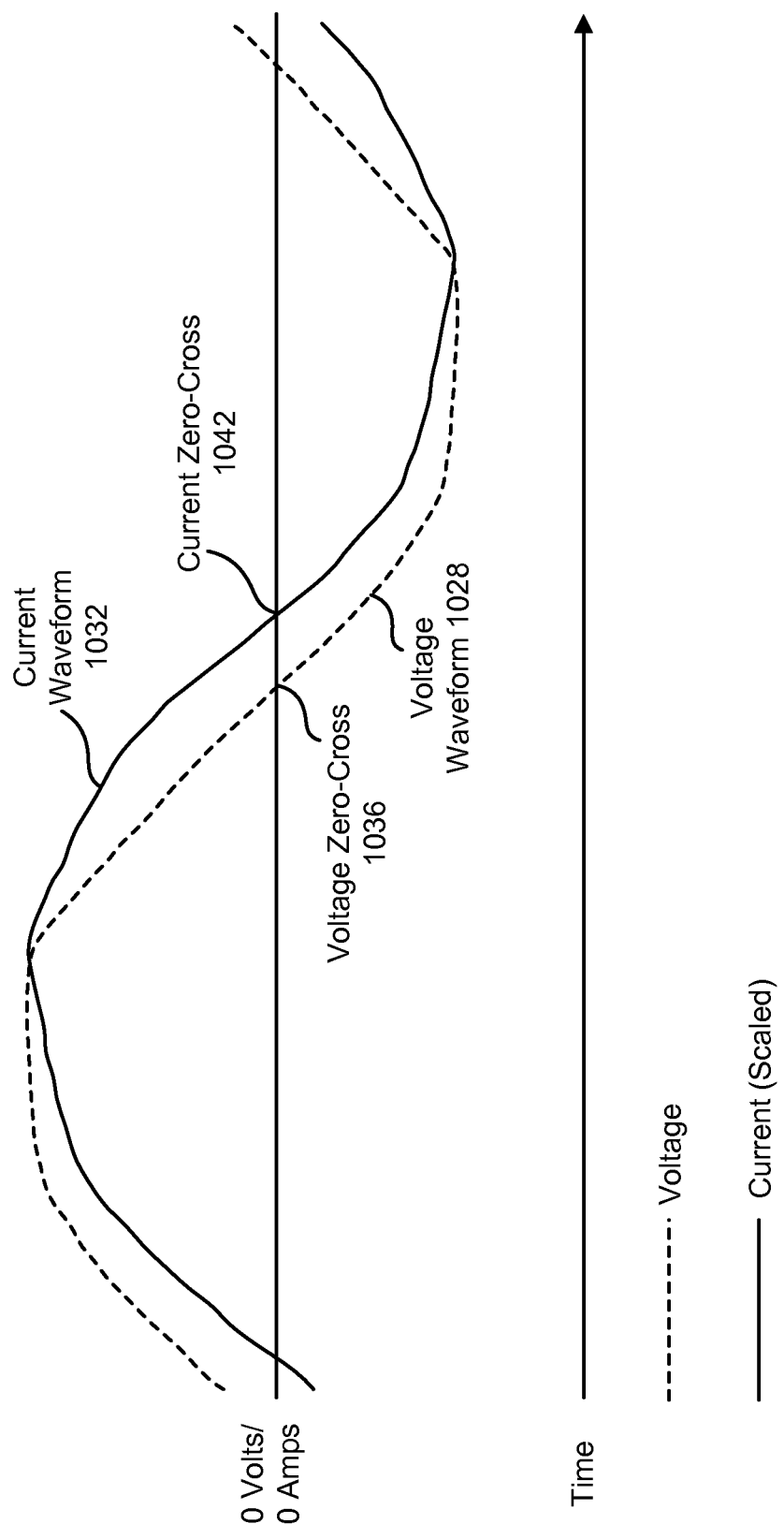
FIG. 10 illustrates a voltage waveform and a current waveform associated with an inductive load type in a non-switch-leg mode.

FIG. 10 illustrates a voltage waveform 1028 and a current waveform 1032 associated with an inductive load type in a non-switch-leg mode. In this example, an inductive load 122 is wired in non-switch-leg mode (e.g., in normal mode with a neutral line). The voltage waveform 1028 and current waveform 1032 may be captured as described above in connection with FIG. 1. It should be noted that in this case (e.g., non-switch-leg mode) it is possible to drive the output at 100 percent. Therefore, the maximum allowable level to operate a load 122 may be 100 percent.

In this example, the voltage zero-cross 1036 is less than the current zero-cross 1042. In other words, the current lags after the voltage at the point the voltage equals zero.

Figure 11:
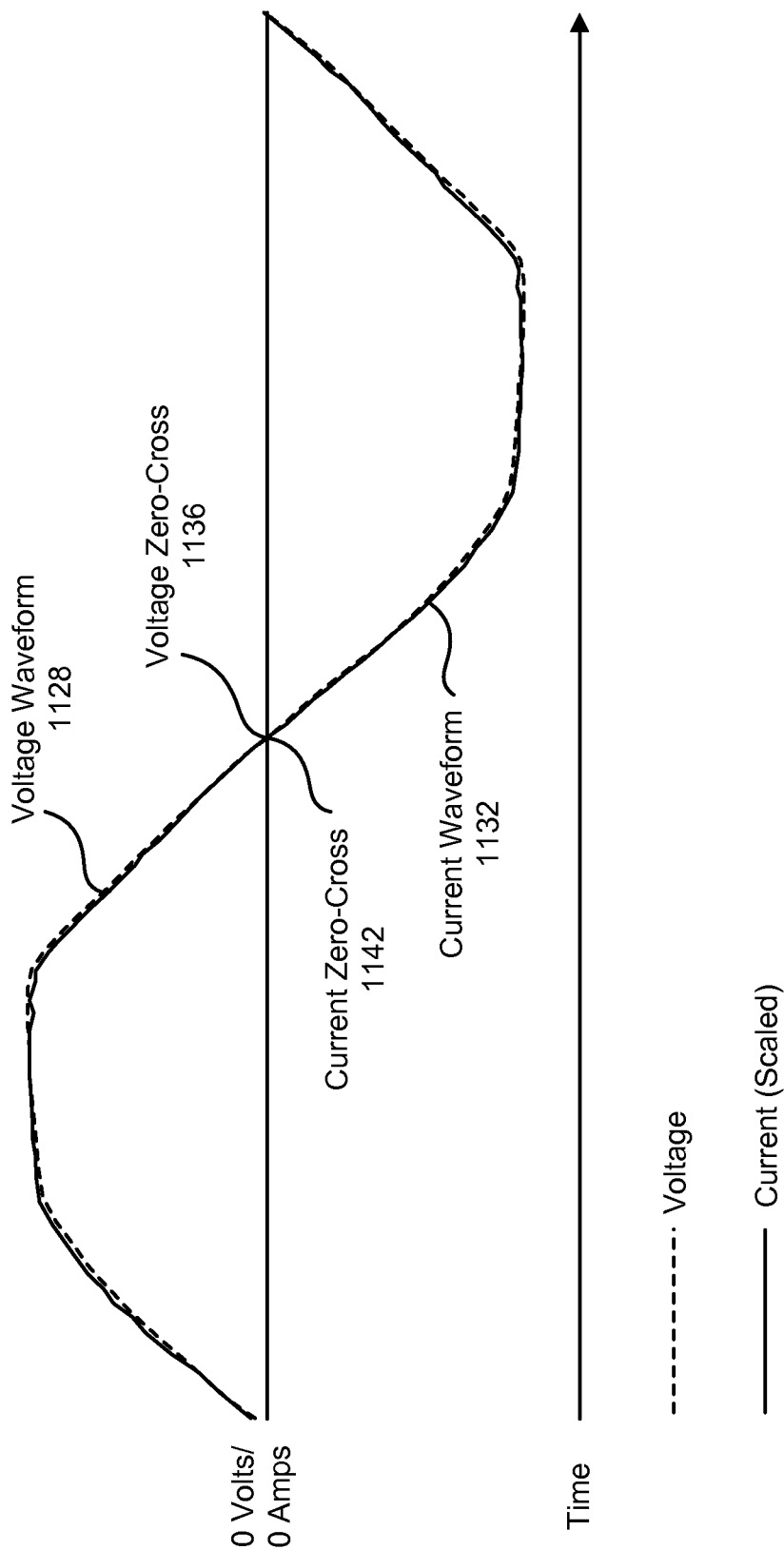
FIG. 11 illustrates a voltage waveform and a current waveform associated with a resistive load type in a non-switch-leg mode.

FIG. 11 illustrates a voltage waveform 1128 and a current waveform 1132 associated with a resistive load type in a non-switch-leg mode. In this example, a resistive load 122 is wired in non-switch-leg mode (e.g., in normal mode with a neutral line). The voltage waveform 1128 and current waveform 1132 may be captured as described above in connection with FIG. 1. It should be noted that in this case (e.g., non-switch-leg mode) it is possible to drive the output at 100 percent. Therefore, the maximum allowable level to operate a load 122 may be 100 percent. With a resistive load 122, it is expected that the voltage and current will be in phase with each other. An example of a resistive load 122 is an incandescent load (e.g., incandescent light), which may be purely resistive.

In this example, the voltage waveform 1128 and current waveform 1132 are in phase with each other through the entire waveform. In other words, there is no appreciable lead or lag between the current and voltage, and the voltage zero-cross 1136 and the current zero-cross 1142 are equal.

Figure 12:
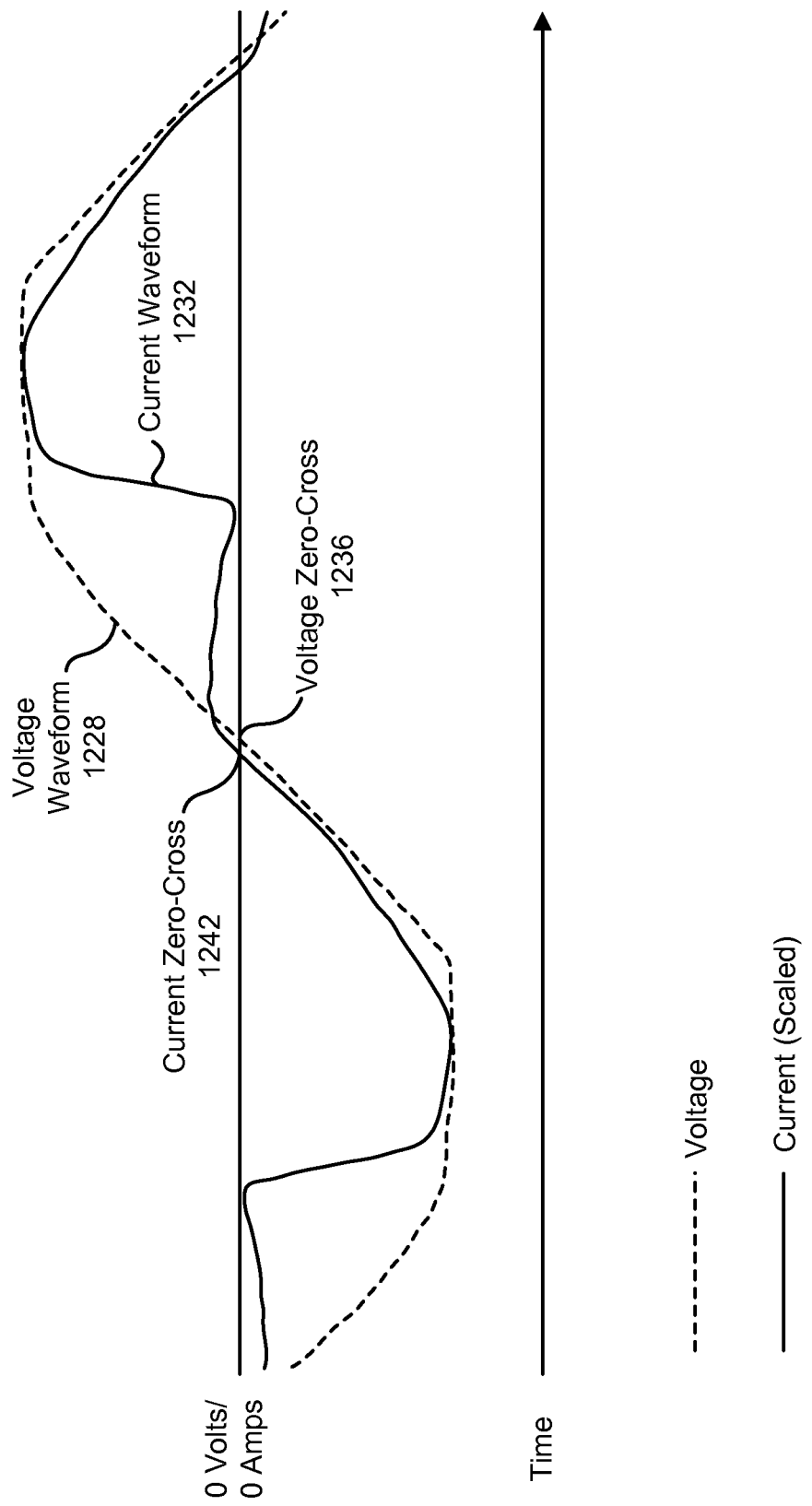
FIG. 12 illustrates a voltage waveform and a current waveform associated with an inductive load type in a non-switch-leg mode.

FIG. 12 illustrates a voltage waveform 1228 and a current waveform 1232 associated with an inductive load type in a non-switch-leg mode. In this example, an inductive load 122 is wired in switch-leg mode (e.g., without a neutral line). The voltage waveform 1228 and current waveform 1232 may be captured as described above in connection with FIG. 1. It should be noted that in this case (e.g., switch-leg mode) it is not possible to drive the output at 100 percent. Therefore, the maximum allowable level to operate a load 122 may be approximately 55 percent.

Inductive loads may be more difficult to detect when wired into a circuit in switch-leg mode. There may not always be a significant current lag in this case. Therefore, other characteristics may identify the load 122 as being an inductive load type. In this example, the current is significantly greater than zero at the point voltage equals zero. The current remains at a positive level for a period of time before dropping to zero. Therefore, the slope of the current waveform 1232 may be used to identify an inductive load type. For example, if the slope of the current waveform 1232 calculated at the voltage zero-cross 1236 is greater than a specified threshold, this may indicate that the load 122 is an inductive load type. Additionally or alternatively, whether the load type is inductive may be determined based on the phase shift between the current waveform 1232 and the voltage waveform 1228. For example, a power factor formula may be utilized and/or the phase of the voltage waveform 1228 and the current waveform 1232 may be compared (e.g., a degree of lead or lag may be determined) in order to determine whether the load type is inductive or another load type.

Figure 13:
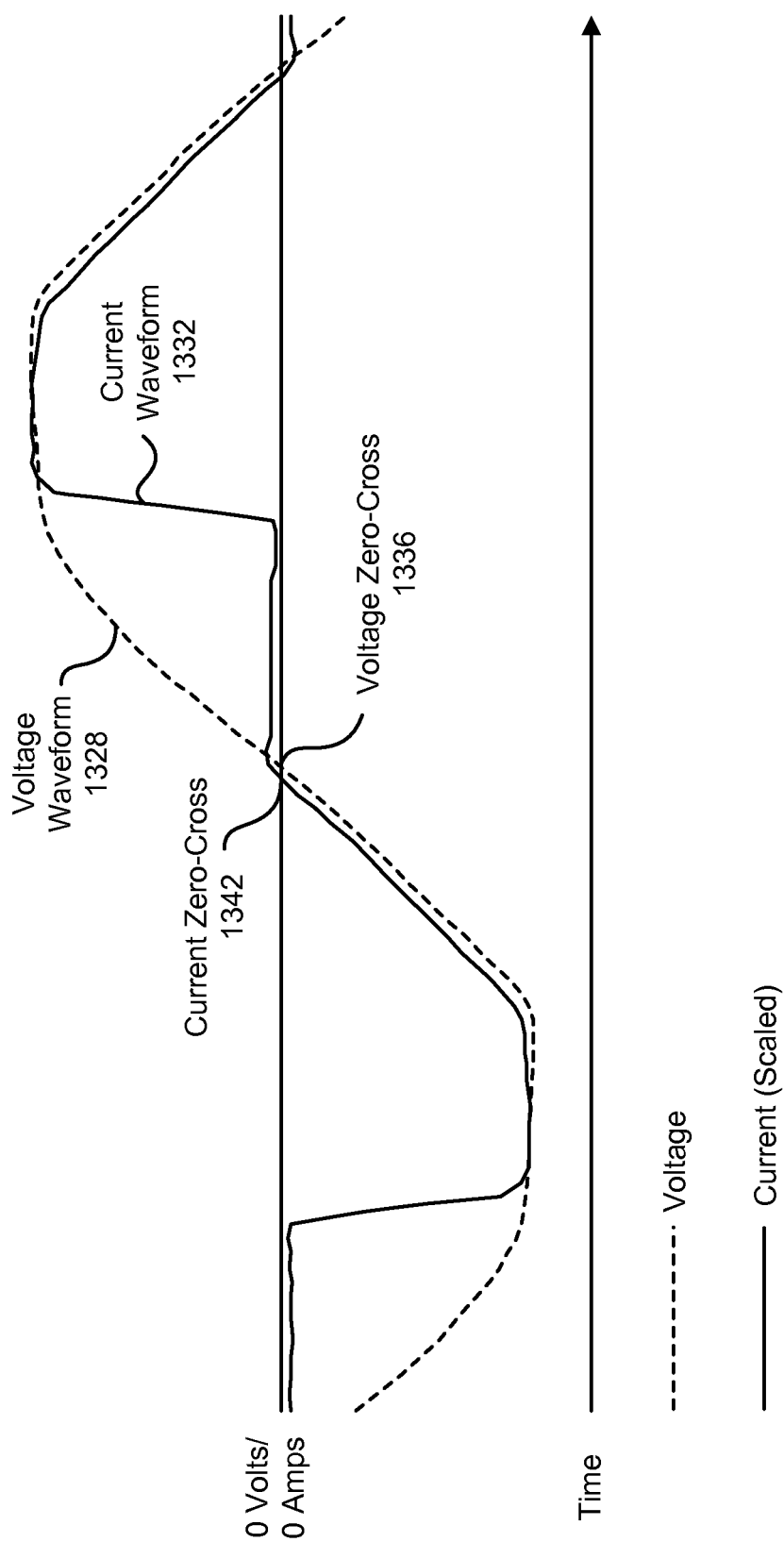
FIG. 13 illustrates a voltage waveform and a current waveform associated with a resistive load type in a non-switch-leg mode.

FIG. 13 illustrates a voltage waveform 1328 and a current waveform 1332 associated with a resistive load type in a non-switch-leg mode. In this example, a resistive load 122 is wired in switch-leg mode (e.g., without a neutral line). The voltage waveform 1328 and current waveform 1332 may be captured as described above in connection with FIG. 1. It should be noted that in this case (e.g., switch-leg mode) it is not possible to drive the output at 100 percent. Therefore, the maximum allowable level to operate a load 122 may be approximately 55 percent. With a resistive load 122, it is expected that the voltage and current will be in phase with each other.

In this example, the voltage waveform 1328 and current waveform 1332 are in phase with each other at the point voltage equals zero. In other words, there is no appreciable lead or lag between the current and voltage, and the voltage zero-cross 1336 and the current zero-cross 1342 are equal.

Figure 14:
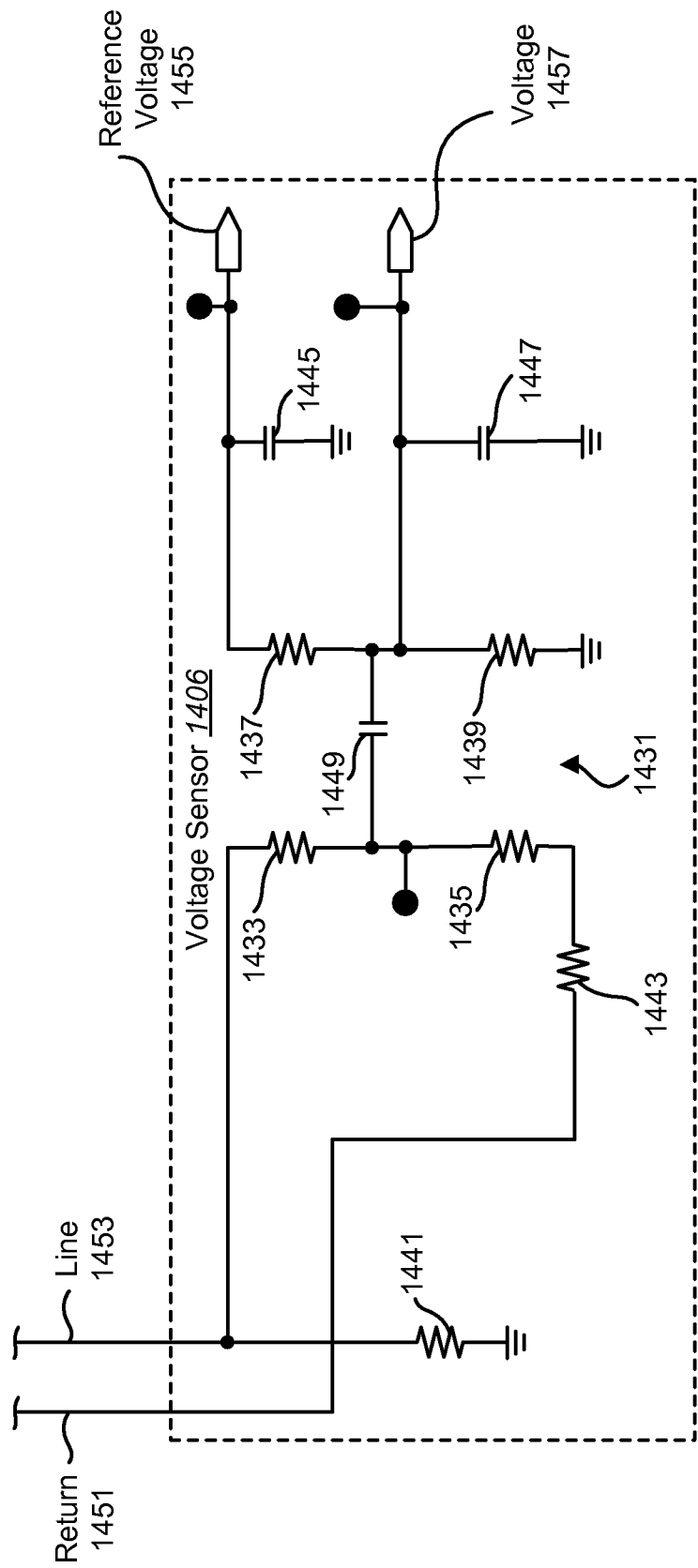
FIG. 14 is a circuit diagram illustrating one configuration of circuitry that may be implemented in the voltage sensor module.

FIG. 14 is a circuit diagram illustrating one configuration of circuitry that may be implemented in the voltage sensor module 104. In one configuration, the voltage sensor module 104 may include circuitry to implement a voltage sensor 1406. For instance, the voltage sensor 1406 illustrated in FIG. 14 may be one example of and/or may provide similar elements and functionality of the voltage sensor 106 described above in connection with FIG. 1.

The voltage sensor 1406 may include a network of resistors 1431 for scaling a voltage (e.g., mains voltage, power supply, etc.). The network of resistors 1431 may include a first resistor 1433, second resistor 1435, third resistor 1437 and fourth resistor 1439. The first resistor 1433 may be coupled to the second resistor 1435 and other components within the electronic device 102. The third resistor 1437 may be coupled to the fourth resistor 1439. The first resistor 1433 may be coupled to a line voltage and a resistor 1441 that is coupled to ground. The second resistor 1435 may be coupled to a fifth resistor 1443 that is coupled to a return line. The third resistor 1437 may be coupled to a first capacitor 1445 and other components within the electronic device 102. The first capacitor 1445 may be coupled to ground. The fourth resistor 1439 may be coupled to a second capacitor 1447 and other components within the electronic device 102. The capacitor 1447 may be coupled to ground. Each of the first resistor 1433, second resistor 1435, third resistor 1437 and fourth resistor 1439 may be coupled to each other via a third capacitor 1449. The inputs of the voltage sensor 1406 may include a return voltage 1451 and a line voltage 1453. The outputs of the voltage sensor 1406 may include the voltage 1457 and a reference voltage 1455.

Figure 15:
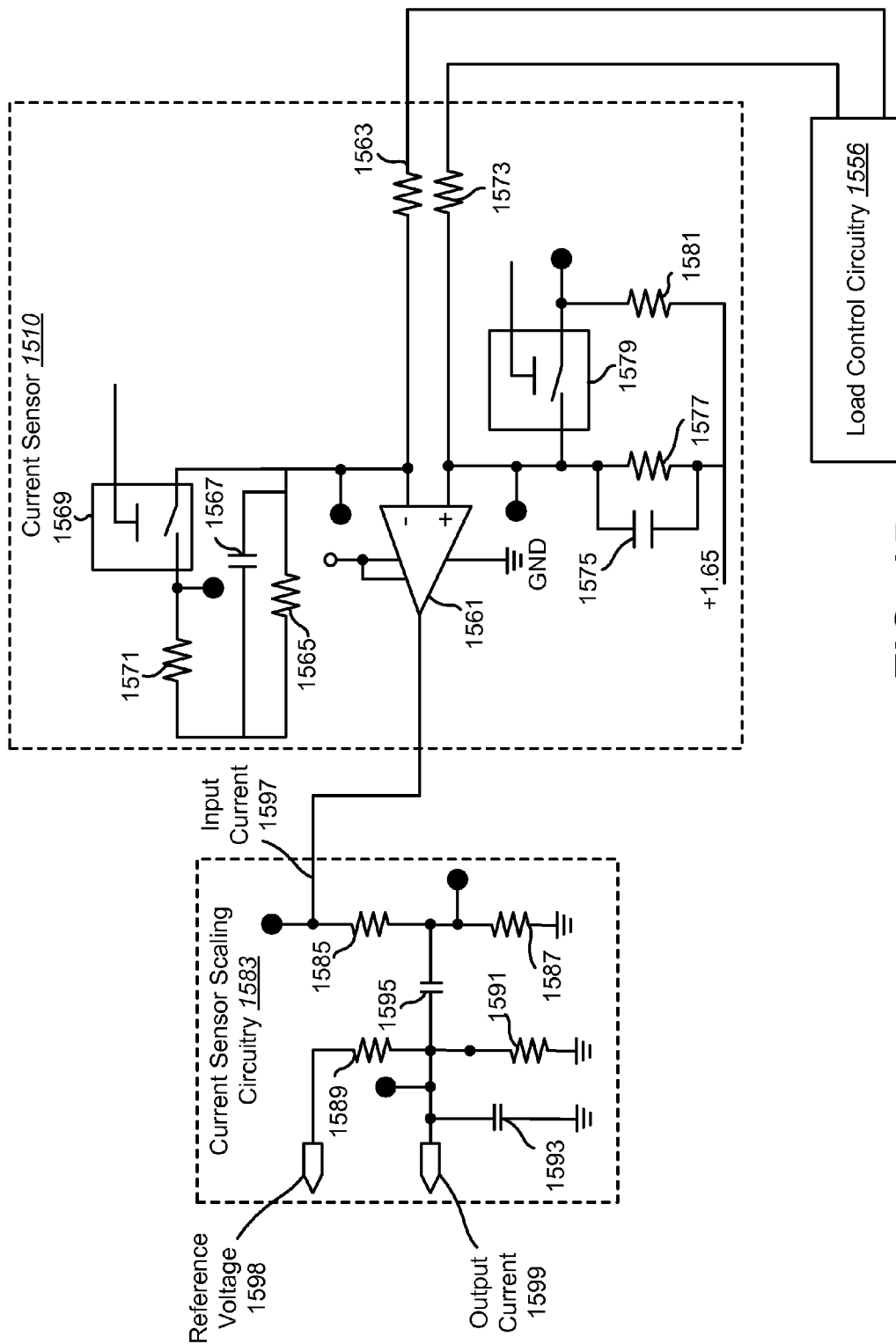
FIG. 15 is a circuit diagram illustrating one configuration of circuitry that may be implemented in the current sensor module.

FIG. 15 is a circuit diagram illustrating one configuration of circuitry that may be implemented in the current sensor module 108. In one configuration, the current sensor module 108 may include circuitry to implement a current sensor 1510. For instance, the current sensor 1510 illustrated in FIG. 15 may be one example of and/or may provide similar elements and functionality of the current sensor 110 described above in connection with FIG. 1.

The circuit of FIG. 15 shows one configuration of resistors, capacitors and other discrete components that may be implemented within the current sensor 1510. For example, the current sensor 1510 may include an amplifier 1561. The amplifier 1561 may be coupled to a supply voltage and to ground. The output of the amplifier 1561 may be coupled to other components within the electronic device 102. The negative input of the amplifier 1561 may be coupled to a first resistor 1563, which may be coupled to load control circuitry 1556. The negative input of the amplifier 1561 may also be coupled to other components within the electronic device 102. The negative input of the amplifier 1561 may also be coupled to a second resistor 1565 and a first capacitor 1567 in parallel. The negative input of the amplifier 1561 may also be coupled to a first analog switch 1569 connected to a third resistor 1571 and other components within the electronic device 102. The first analog switch 1569 and the third resistor 1571 may be in parallel to the first capacitor 1567 and the second resistor 1565. The positive input of the amplifier 1561 may be coupled to a fourth resistor 1573, which is coupled to the load control circuitry 1556. The positive input of the amplifier 1561 may be coupled to other components within the electronic device 102. The positive input of the amplifier 1561 may also be coupled to a second capacitor 1575 and a fifth resistor 1577 in parallel. The positive input of the amplifier 1561 may also be coupled to a second analog switch 1579, which is coupled to a sixth resistor 1581. The second analog switch 1579 and the sixth resistor 1581 may be in parallel to the fifth resistor 1577 and the second capacitor 1575. The second capacitor 1575, fifth resistor 1577 and sixth resistor 1581 may be coupled to a reference voltage between the supply voltage and the ground.

The current sensor 1510 may include a first analog switch 1569 and a second analog switch 1579. The analog switches 1569, 1579 may be used to control a threshold value of current flowing through the electronic device 102. For example, a specific load 122 may have an inrush current and settling time specifications that indicate different levels of current that may safely flow through the electronic device 102 at a given time of operation. The analog switches 1569, 1579 may be used to modify a threshold value based on an appropriate amount of current that should be allowed to pass through the electronic device 102. The analog switches 1569, 1579 may be adjusted multiple times during operation of a load 122 to adjust for current variations.

In some configurations, the current sensor module 108 may also include circuitry to implement current sensor scaling circuitry 1583. The current sensor scaling circuitry 1583 may be implemented in one configuration of the current sensor module 108 described above in connection to FIG. 1. For example, the current sensor scaling circuitry 1583 may interface between a current sensor 1510 and a microprocessor. The current sensor scaling circuitry 1583 may include a network of resistors for scaling a current. The network of resistors may include a first resistor 1585, second resistor 1587, third resistor 1589 and fourth resistor 1591. The first resistor 1585 may be coupled to other components within the electronic device 102. The first resistor 1585 may also be coupled to the second resistor 1587. The second resistor 1587 may be coupled to ground. The third resistor 1589 may be coupled to a reference voltage 1598. The third resistor 1589 may also be coupled to the fourth resistor 1591 and to other components within the electronic device 102. The fourth resistor 1591 may be coupled in parallel to a first capacitor 1593 and a current reference. The fourth resistor 1591 and first capacitor 1593 may each be coupled to ground. Each of the first resistor 1585, second resistor 1587, third resistor 1589 and fourth resistor 1591 may be coupled together via a second capacitor 1595. The inputs of the current sensor scaling circuitry 1583 may include an input current 1597 (from the current sensor 1510, for instance). The outputs of the current sensor scaling circuitry 1583 may include an output current 1599 and a reference voltage 1598.

Figure 16:
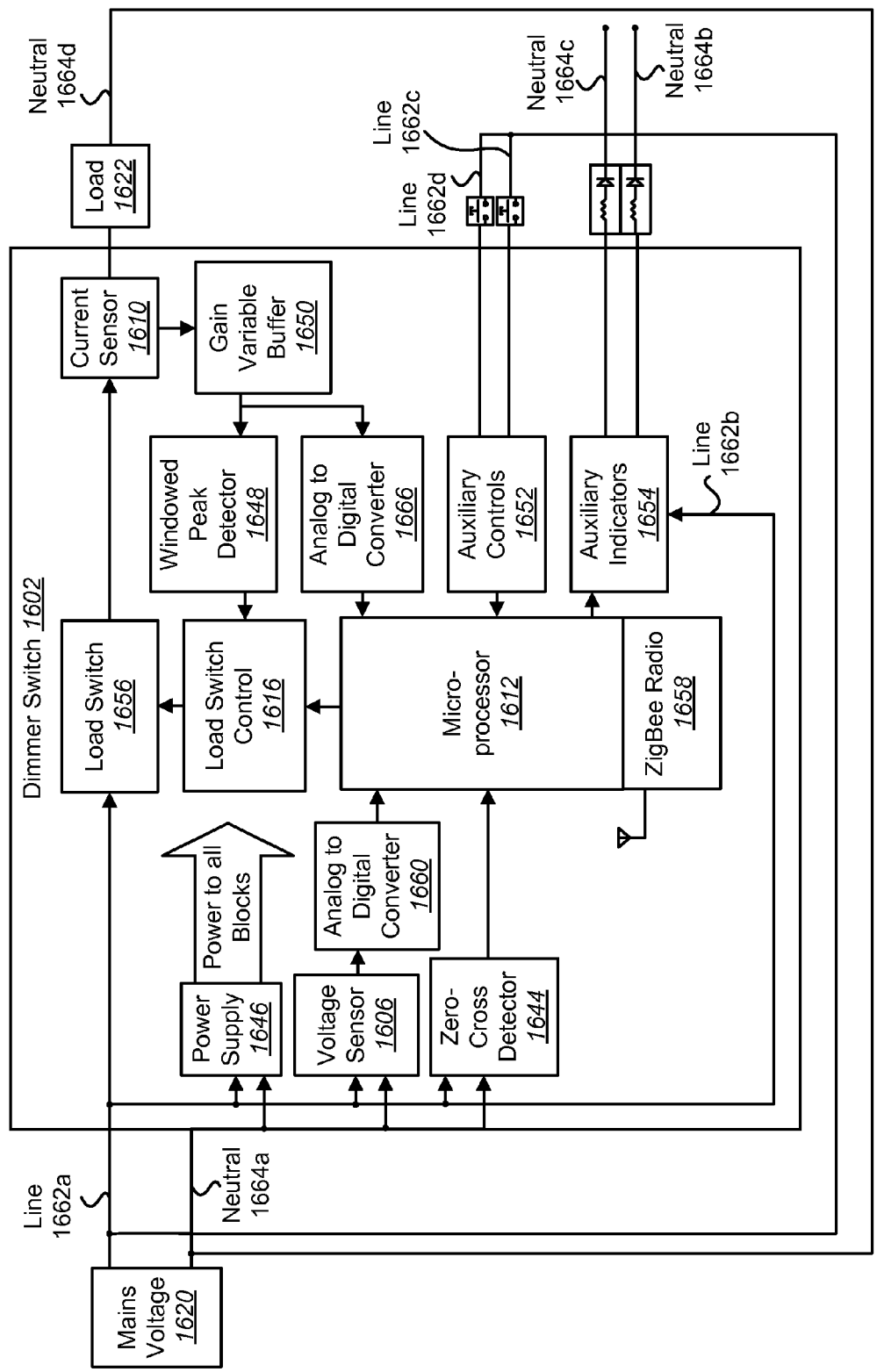
FIG. 16 is a block diagram illustrating one configuration of a dimmer/switch in which systems and methods for managing energy may be implemented.

FIG. 16 is a block diagram illustrating one configuration of a dimmer/switch 1602 in which systems and methods for managing energy may be implemented. The dimmer/switch 1602 of FIG. 16 may be one configuration of the electronic device 102 described above in connection with FIG. 1. In some configurations, one or more of the elements described in connection with FIG. 16 may be configured with similar functionality to corresponding elements described in connection with FIG. 1.

The dimmer/switch 1602 may receive a voltage waveform 328 from a mains voltage 1620. The dimmer/switch 1602 may also include an internal power supply 1646 coupled to the mains voltage 1620 that provides power to each module/block within the dimmer/switch 1602. The mains voltage

1620 may provide power to the dimmer/switch 1602 via a line 1662*a-d* coupled to a load switch 1656, a power supply 1646, a voltage sensor 1606, a zero-cross detector 1644, auxiliary indicators 1654 and auxiliary controls 1652. The mains voltage 1620 may also be coupled to the power supply 1646, the voltage sensor 1606, the zero-cross detector 1644, the auxiliary indicators 1654 and a load 1622 via a neutral line 1664*a-d*. The neutral line 1664*a-d* may be a return line for different modules/blocks within the dimmer/switch 1602 providing a return to a ground reference voltage.

The dimmer/switch 1602 may include a microprocessor 1612. The microprocessor 1612 may include some or all of the components of the computing module 112 described above in connection with FIG. 1. The microprocessor 1612 may include or be coupled to a ZigBee radio 1658. The ZigBee radio 1658 may be used for communicating with other electronic devices. The voltage sensor 1606 may be coupled to the microprocessor 1612 via an A/D converter 1660. The current sensor 1610 may be coupled to the microprocessor 1612 via a second A/D converter 1666. The current sensor 1610 may also be coupled to a gain variable buffer 1650. The gain variable buffer 1650 may be coupled to a windowed peak detector 1648 and the second A/D converter 1666. In some configurations, the A/D converters 1660, 1666 are part of the microprocessor 1612. The microprocessor 1612 may also be coupled to the zero-cross detector 1644, the auxiliary controls 1652 and the auxiliary indicators 1654. The microprocessor 1612 may also be coupled to the load switch 1656 for engaging or disengaging the load 1622 via instruction from a load switch control 1616.

Figure 17:
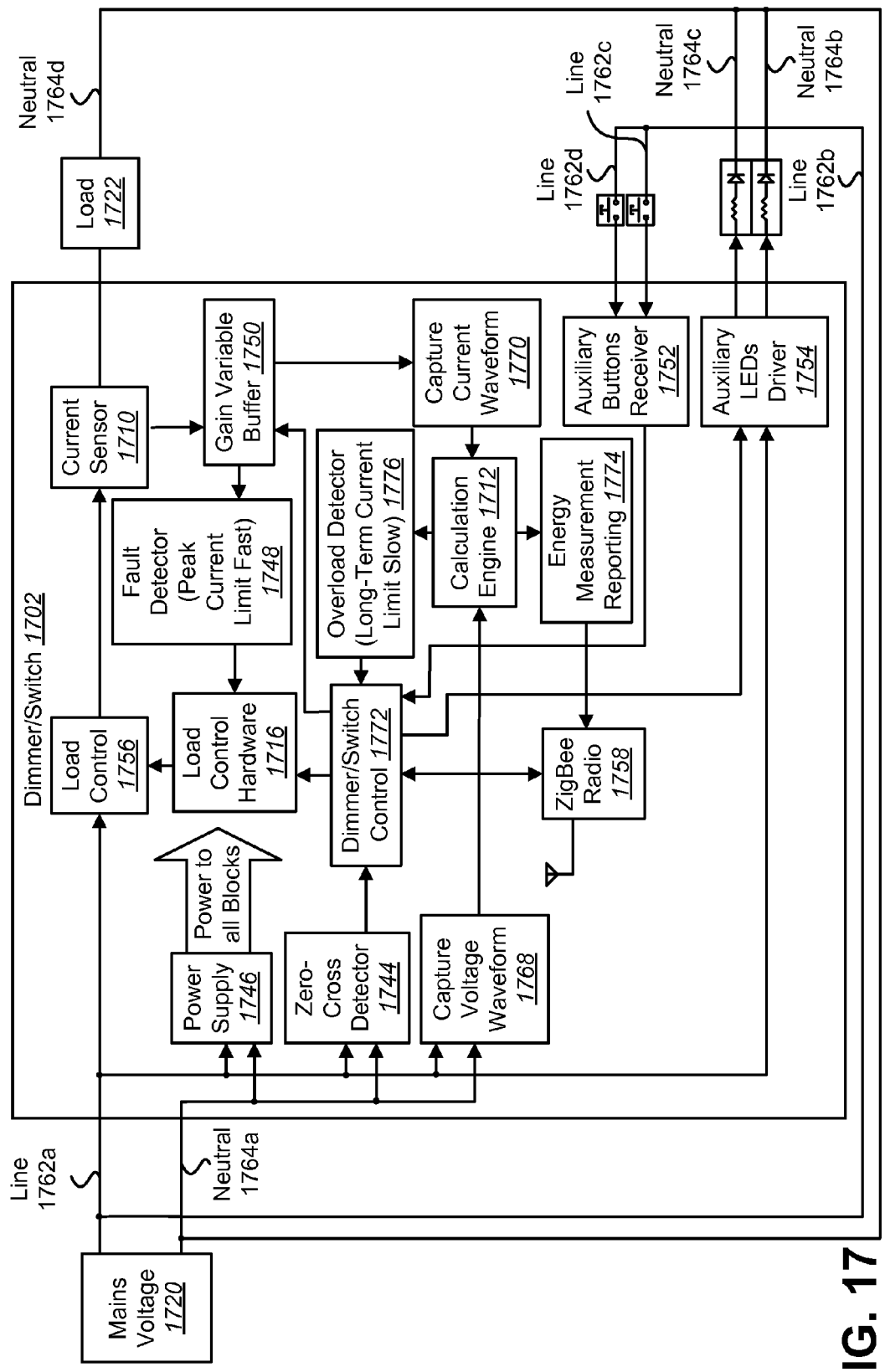
FIG. 17 is a block diagram illustrating another configuration of a dimmer/switch in which systems and methods for managing energy may be implemented.

FIG. 17 is a block diagram illustrating another configuration of a dimmer/switch 1702 in which systems and methods for managing energy may be implemented. The dimmer/switch 1702 may be one configuration of the electronic device 102 and/or the dimmer/switch 102 described above in connection with FIG. 1 and FIG. 16. In some configurations, one or more of the elements described in connection with FIG. 17 may be configured with similar functionality to corresponding elements described in connection with FIG. 1 and/or FIG. 16.

The dimmer/switch 1702 may receive a voltage waveform from a mains voltage 1720. The dimmer/switch 1702 may also include an internal power supply 1746 coupled to the mains voltage 1720 that provides power to each module/block within the dimmer/switch 1702. The mains voltage 1720 may provide power to the dimmer/switch 1702 via a line 1762*a-d* coupled to a load control 1756, a power supply 1746, a zero-cross detector 1744, a capture voltage waveform block 1768, auxiliary buttons receiver 1752 and an auxiliary LEDs driver 1754. The mains voltage 1720 may also be coupled to the power supply 1746, zero-cross detector 1744, capture voltage waveform block 1768, auxiliary LEDs driver 1754 and the load 1722 via a neutral line 1764*a-d*. The neutral line 1764*a-d* may be a return line for different modules/blocks within the dimmer/switch 1702 providing a return to a ground reference voltage. The dimmer/switch 1702 may also include a load control 1756 coupled to a load control hardware 1716 and a current sensor 1710. The load control hardware 1716 may be coupled to a fault detector 1748 (e.g., peak current limit fast) and a microprocessor. The fault detector 1748 may be coupled to a gain variable buffer 1750. The gain variable buffer 1750 may be coupled to the current sensor 1710 and the microprocessor. Moreover, each of the power supply 1746, zero-cross detector 1744, capture voltage waveform block 1768, auxiliary LEDs driver 1754 and auxiliary buttons receiver 1752 may be coupled to a microprocessor housed within the dimmer/switch 1702.

Many of the components shown on the dimmer/switch 1702 of FIG. 17 may be implemented within a microprocessor. For example, the microprocessor may include a dimmer/switch control 1772, an overload detector 1776 (e.g., long-term current limit slow), a calculation engine 1712, a capture current waveform block 1770, an energy measurement reporting block 1774 and a ZigBee radio 1758. Some or all of these components may be housed within the microprocessor and coupled to other modules/blocks within the dimmer/switch 1702. For example, the dimmer/switch control 1772 may be coupled to the zero-cross detector 1744, the load control hardware 1716, the gain variable buffer 1750, the ZigBee radio 1758, the auxiliary LEDs driver 1754 and the auxiliary buttons receiver 1752. The overload detector 1776 may be coupled to the calculation engine 1712. The calculation engine 1712 may be coupled to the capture voltage waveform block 1768, the capture current waveform block 1770 and the energy measurement reporting block 1774. The energy measurement reporting block 1774 may be coupled to the ZigBee radio 1758.

Figure 18:
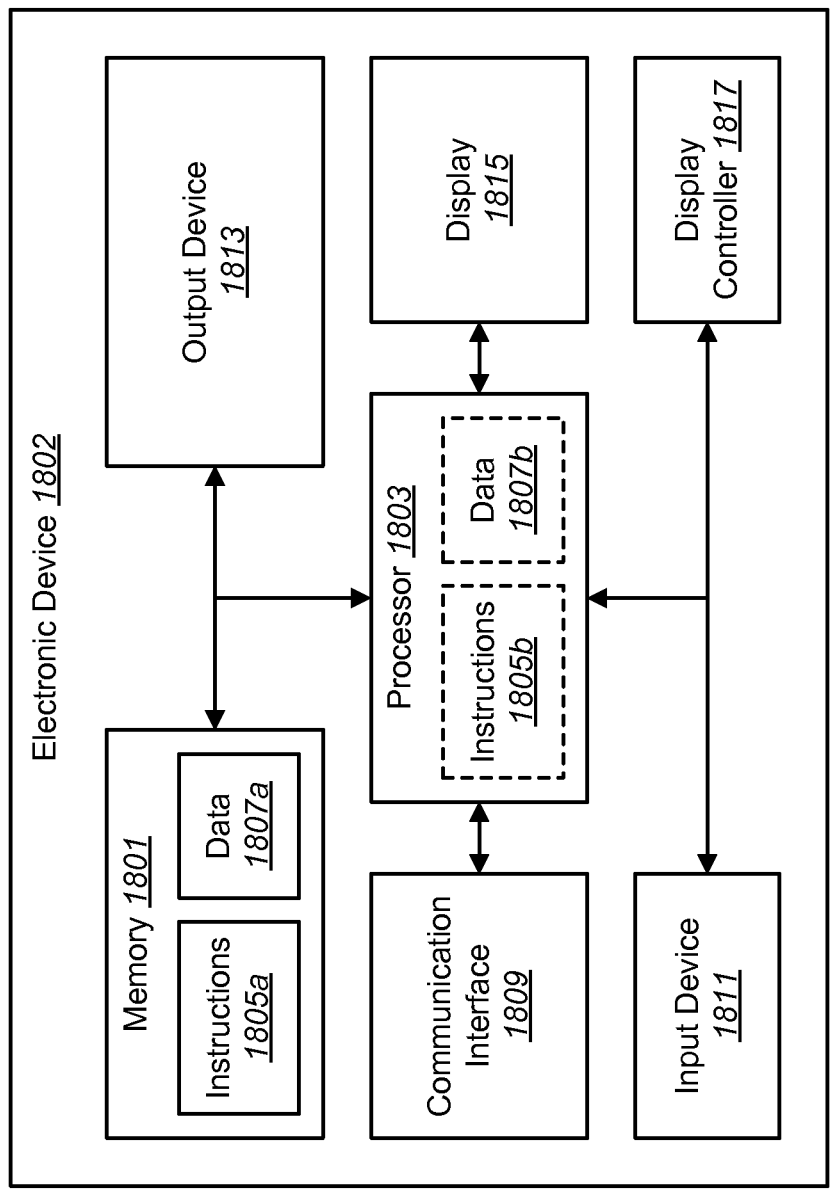
FIG. 18 illustrates various components that may be utilized on an electronic device.

FIG. 18 illustrates various components that may be utilized on an electronic device 1802. One or more of the electronic devices 102, 1602, 1702 described previously may be configured similar to the electronic device 1802 illustrated in FIG. 18. For example, the electronic device 1802 may be configured to perform the methods 200, 700 described above. The electronic device 1802 may include a memory 1801, a communication interface 1809, an input device 1811, a processor 1803, an output device 1813, a display 1815 and a display controller 1817. The memory 1801 may store instructions 1805*a* and data 1807*a*. The processor 1803 may operate on instructions 1805*b* and data 1807*b*.

The term "discrete circuit" refers to an electronic circuit built out of discrete components. Examples of discrete components include resistors, capacitors, inductors, transformers, transistors, etc. In some configurations, a discrete circuit may not be a solid state integrated circuit that performs all of the functions described herein. However, a discrete circuit may include one or more discrete components contained in the same packaging (e.g., TRIAC, bridge rectifier, solid state relay, etc.). In some configurations, a discrete circuit made from discrete components refers to a circuit having separate components or circuits that perform individual finite functions. For instance, examples of a discrete circuit may include the voltage sensor module 104, controller module 116, computing module 112 and current sensor module 108 that may perform separate and discrete functions while being implemented within an electronic device 102. The electronic device 102 may be housed within a wall box. Moreover, each module within the electronic device 102 may include discrete components or discrete circuits within each module. In some instances, the term "circuit" may refer to a circuit in its entirety, for example, including the impedance of the wall box device and the impedance of the load.

As used herein, the term "coupled" and other variations thereof may mean that one element is connected to another element directly or indirectly. For example, if a first element is coupled to a second element, the first element may be connected directly to the second element or may be connected to the second element through another element.

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The term "computer-readable medium" refers to any available medium that can be accessed by a computer or processor. A computer-readable medium may be non-transitory and tangible. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for detecting a load type, comprising:
placing an electronic device in a forward phase mode;
operating a load at a maximum allowable level;
capturing a voltage waveform;
capturing a current waveform;
obtaining a voltage zero-cross based on the voltage waveform;
obtaining a current zero-cross based on the current waveform;
determining whether the electronic device is in a switch leg mode when the voltage zero-cross equals the current zero-cross; and
determining a load type based on the voltage zero-cross and the current zero-cross, wherein when the electronic device is in the switch leg mode, determining the load type comprises:
determining whether a slope of the current waveform at the voltage zero-cross is greater than a threshold, wherein if the slope is greater than the threshold, then the load type is inductive, and wherein if the slope is less than the threshold, then the load type is resistive.

2. The method of claim 1, wherein if the current zero-cross is less than the voltage zero-cross, then the load type is capacitive.

3. The method of claim 1, wherein if the voltage zero-cross is less than the current zero-cross, then the load type is inductive.

4. The method of claim 1, wherein if the electronic device is not in a switch leg mode and the voltage zero-cross equals the current zero-cross, then the load type is resistive.

5. The method of claim 1, further comprising determining whether to drive the load connected to the electronic device in a forward phase mode or a reverse phase mode based on the load type.

6. The method of claim 5, wherein if the load type is inductive, then the load is driven in the forward phase mode, and wherein if the load type is capacitive, then the load is driven in the reverse phase mode.

7. An electronic device for detecting a load type, comprising:
a voltage sensor module, wherein the voltage sensor module captures a voltage waveform;
a current sensor module, wherein the current sensor module captures a current waveform;
a computing module coupled to the voltage sensor module and to the current sensor module, wherein the computing module:
places the electronic device in a forward phase mode;
operates a load at a maximum allowable level;
obtains a voltage zero-cross based on the voltage waveform;
obtains a current zero-cross based on the current waveform;
determines whether the electronic device is in a switch leg mode when the voltage zero-cross equals the current zero-cross; and
determines a load type based on the voltage zero-cross and the current zero-cross, wherein when the electronic device is in the switch leg mode, determining the load type comprises:
determining whether a slope of the current waveform at the voltage zero-cross is greater than a threshold, wherein if the slope is greater than the threshold, then the load type is inductive, and wherein if the slope is less than the threshold, then the load type is resistive.

8. The electronic device of claim 7, wherein if the current zero-cross is less than the voltage zero-cross, then the load type is capacitive.

9. The electronic device of claim 7, wherein if the voltage zero-cross is less than the current zero-cross, then the load type is inductive.

10. The electronic device of claim 7, wherein if the electronic device is not in a switch leg mode and the voltage zero-cross equals the current zero-cross, then the load type is resistive.

11. The electronic device of claim 7, further comprising the computing module determining whether to drive the load connected to the electronic device in a forward phase mode or a reverse phase mode based on the load type.

12. The electronic device of claim 11, wherein if the load type is inductive, then the load is driven in the forward phase mode, and wherein if the load type is capacitive, then the load is driven in the reverse phase mode.

13. A non-transitory computer-readable medium comprising executable instructions for:
   placing an electronic device in a forward phase mode;
   operating a load at a maximum allowable level;
   capturing a voltage waveform;
   capturing a current waveform;
   obtaining a voltage zero-cross based on the voltage waveform;
   obtaining a current zero-cross based on the current waveform;
   determining whether the electronic device is in a switch leg mode when the voltage zero-cross equals the current zero-cross; and
   determining a load type based on the voltage zero-cross and the current zero-cross, wherein when the electronic device is in the switch leg mode, determining the load type comprises:
      determining whether a slope of the current waveform at the voltage zero-cross is greater than a threshold, wherein if the slope is greater than the threshold, then the load type is inductive, and wherein if the slope is less than the threshold, then the load type is resistive.

14. The non-transitory computer-readable medium of claim 13, wherein if the current zero-cross is less than the voltage zero-cross, then the load type is capacitive, and wherein if the voltage zero-cross is less than the current zero-cross, then the load type is inductive.

15. The non-transitory computer-readable medium of claim 13, wherein if the electronic device is not in a switch leg mode and the voltage zero-cross equals the current zero-cross, then the load type is resistive.

* * * * *